(12) United States Patent
Kogura et al.

(10) Patent No.: US 9,340,872 B2
(45) Date of Patent: May 17, 2016

(54) CLEANING METHOD, MANUFACTURING METHOD OF SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Shintaro Kogura, Toyama (JP); Ryota Sasajima, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 14/752,131

(22) Filed: Jun. 26, 2015

(65) Prior Publication Data

US 2015/0376781 A1  Dec. 31, 2015

(30) Foreign Application Priority Data

Jun. 30, 2014  (JP) ................. 2014-134808

(51) Int. Cl.
- C23F 1/00       (2006.01)
- H01L 21/306    (2006.01)
- C23C 16/44     (2006.01)
- H01L 21/02     (2006.01)
- C23C 16/52     (2006.01)

(52) U.S. Cl.
CPC ......... *C23C 16/4405* (2013.01); *C23C 16/4408* (2013.01); *C23C 16/52* (2013.01); *H01L 21/02271* (2013.01)

(58) Field of Classification Search
CPC  C23C 16/4405; C23C 16/4408; C23C 16/52; H01L 21/02271

See application file for complete search history.

(56) References Cited

U.S. PATENT DOCUMENTS

| | | | |
|---|---|---|---|
| 2005/0284575 A1 | 12/2005 | Hasebe et al. | |
| 2009/0253269 A1* | 10/2009 | Tsuneda | C23C 16/34 438/758 |
| 2013/0102161 A1* | 4/2013 | Asai | H01L 21/02334 438/791 |
| 2013/0171919 A1* | 7/2013 | Shinohara | B01D 53/005 454/49 |

FOREIGN PATENT DOCUMENTS

| | | |
|---|---|---|
| JP | 2002-222805 A | 8/2002 |
| WO | 2004/070802 A1 | 8/2004 |

* cited by examiner

*Primary Examiner* — Karen Kusumakar
(74) *Attorney, Agent, or Firm* — Volpe and Koenig, P.C.

(57) ABSTRACT

There is provided a cleaning method including cleaning an interior of a process chamber in which a substrate is processed, by supplying a cleaning gas into the process chamber and exhausting the cleaning gas from the process chamber via an exhaust pipe; and cooling the exhaust pipe by maintaining a state where distribution of the cleaning gas into the exhaust pipe is substantially stopped. Also, the act of cleaning the interior of the process chamber and the act of cooling the exhaust pipe are repeated alternately.

16 Claims, 8 Drawing Sheets

CLEANING METHOD, MANUFACTURING METHOD OF SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2014-134808, filed on Jun. 30, 2014, the entire contents of which are incorporated herein by reference.

TECHNICAL FIELD

The present disclosure relates to a cleaning method, a manufacturing method of a semiconductor device, a substrate processing apparatus and a recording medium.

BACKGROUND

As one of the procedures for manufacturing a semiconductor device, there may be a procedure of forming a thin film on a substrate in a process chamber by supplying a precursor gas or a reaction gas to the substrate. During this film forming process, deposits such as a thin film are adhered to an interior of the process chamber. Therefore, a cleaning process of removing the deposits adhered to the interior of the process chamber may be performed by supplying a cleaning gas into the process chamber and exhausting the cleaning gas from the process chamber through an exhaust pipe after the film forming process.

However, in some cases, during the above-mentioned cleaning process, an inner wall of the exhaust pipe may be corroded.

SUMMARY

The present disclosure provides some techniques capable of preventing an exhaust pipe from being corroded due to performing a cleaning process.

According to an aspect of the present disclosure, there is provided a technique including cleaning an interior of a process chamber in which a substrate is processed, by supplying a cleaning gas into the process chamber and exhausting the cleaning gas from the process chamber via an exhaust pipe; and cooling the exhaust pipe by maintaining a state where distribution of the cleaning gas into the exhaust pipe is substantially stopped, wherein the act of cleaning the interior of the process chamber and the act of cooling the exhaust pipe are repeated alternately.

DETAILED DESCRIPTION

Embodiment

An embodiment of the present disclosure is described below in detail with reference to FIGS. 1 to 3.

(1) Configuration of Substrate Processing Apparatus

Figure 1:
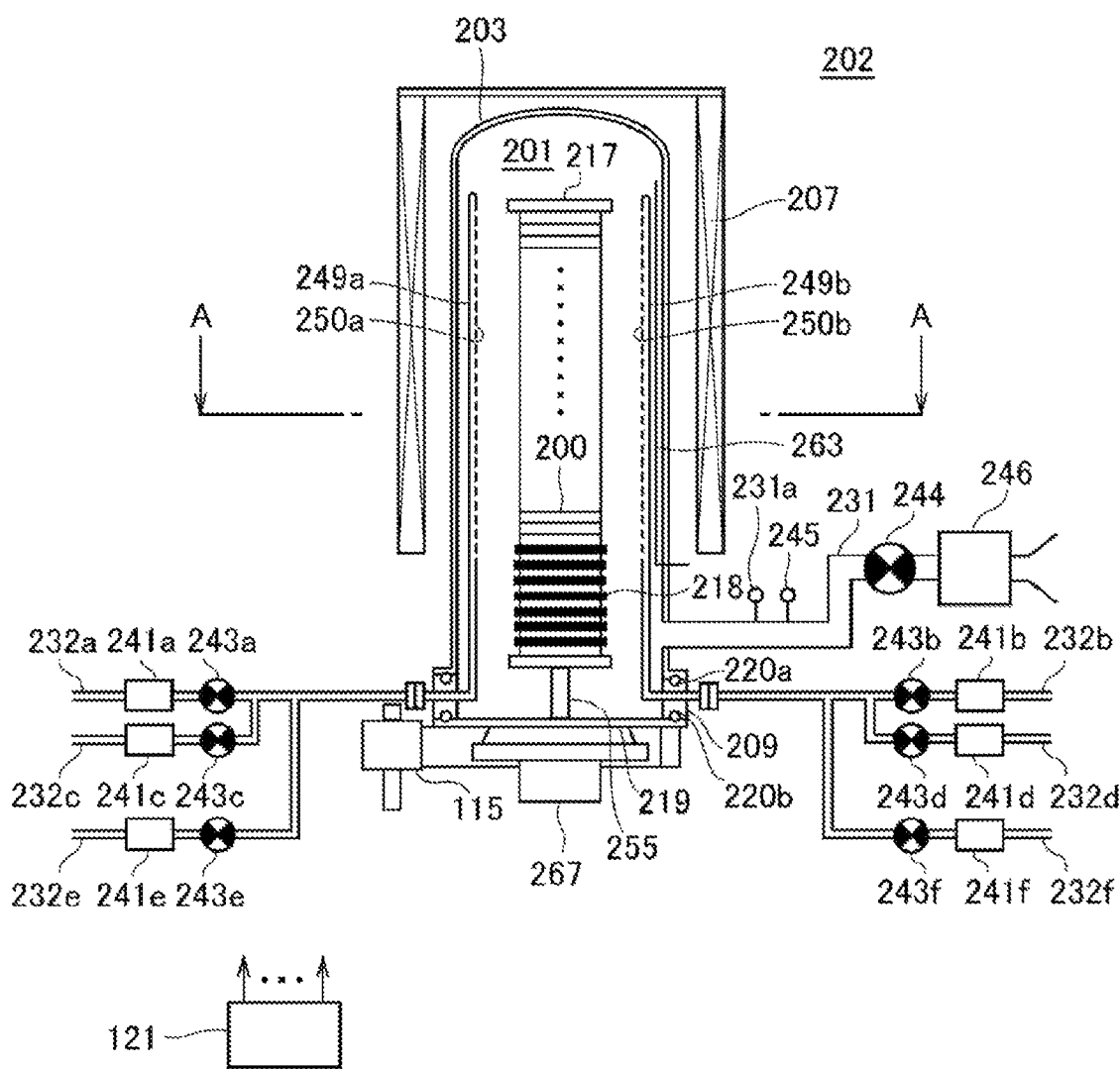
FIG. 1 is a schematic view illustrating a configuration of a vertical processing furnace of a substrate processing apparatus suitably used in one embodiment of the present disclosure, in which a portion of the processing furnace is shown in a longitudinal sectional view.
Figure 2:
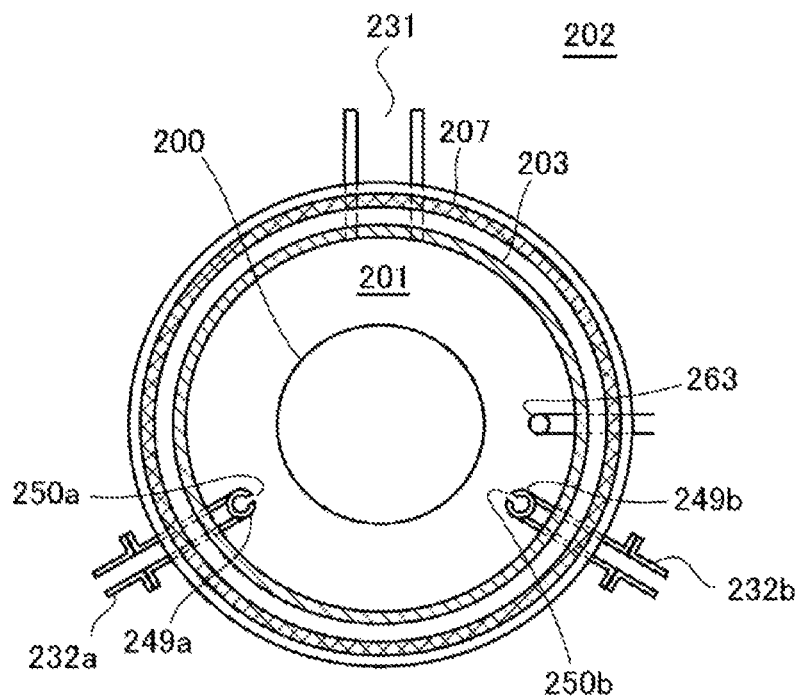
FIG. 2 is a schematic view illustrating a configuration of the vertical processing furnace of the substrate processing apparatus suitably used in the embodiment of the present disclosure, in which a portion of the processing furnace is shown in a sectional view taken along a line A-A in FIG. 1.

As shown in FIG. 1, a processing furnace 202 includes a heater 207 serving as a heating unit (or a heating mechanism). The heater 207 is of a cylindrical shape, and is supported by a heater base (not shown) serving as a support plate and vertically arranged. The heater 207 also acts as an activating mechanism (or an exciting unit) to activate (or excite) gas by using heat, which will be described later.

A reaction tube 203 is installed inside the heater 207 to be concentric with the heater 207. The reaction tube 203 is made of a heat resistant material such as quartz (i.e., $SiO_2$) or silicon carbide (SiC) and has a cylindrical shape with its upper end closed and its lower end opened. A manifold (or an inlet flange) 209 is installed below the reaction tube 203 to be concentric with the reaction tube 203. The manifold 209 is made of, for example, metal such as stainless steel (SUS), and is formed in a cylindrical shape with its upper and lower ends opened. The upper end of the manifold 209 engages with the lower end of the reaction tube 203 and is configured to support the reaction tube 203. An O-ring 220a serving as a seal member is installed between the manifold 209 and the reaction tube 203. As the manifold 209 is supported by the heater base, the reaction tube 203 is in a vertically installed state. A process vessel (or a reaction vessel) is constituted mainly by the reaction tube 203 and the manifold 209. A process chamber 201 is formed in a hollow cylindrical portion of the process vessel. The process chamber 201 is configured to accommodate (and process) a plurality of wafers 200 as substrates in a state where the wafers 200 are horizontally positioned and vertically stacked in multiple stages in a boat 217 which will be described later.

Nozzles 249a and 249b are installed in the process chamber 201 to extend through the manifold 209. The nozzles 249a and 249b are made of, for example, heat resistant material such as quartz or SiC. The nozzles 249a and 249b are connected with gas supply pipes 232a and 232b, respectively. The gas supply pipe 232a is connected with a gas supply pipe 232c and the gas supply pipe 232b is connected with a gas supply pipe 232d. In this manner, the two nozzles 249a and 249b and the four gas supply pipes 232a to 232d are connected to the reaction tube 203, and thus, multiple kinds of gases can be supplied into the process chamber 201.

MFCs (Mass Flow Controllers) 241a to 241d, which are flow rate controllers (or flow rate control parts), and valves 243a to 243d, which are opening/closing valves are installed, respectively, in the gas supply pipes 232a to 232d in the above-mentioned order from upstream sides of the gas supply pipes 232a to 232d. Gas supply pipes 232e and 232f for supplying inert gas are connected to the gas supply pipes 232a and 232b, respectively, at downstream sides of the valves 243a and 243b. MFCs 241e and 241f, which are flow rate controllers (or flow rate control parts), and valves 243e and 243f, which are opening/closing valves, are installed, respectively, in the gas supply pipes 232e and 232f in the above-mentioned order from upstream sides of the gas supply pipes 232e and 232f.

The nozzles 249a and 249b are connected to leading end portions of the gas supply pipes 232a and 232b, respectively. As shown in FIG. 2, each of the nozzles 249a and 249b is installed in an annular space between an inner wall of the reaction tube 203 and the wafers 200. The nozzles 249a and 249b are vertically installed along the inner wall of the reaction tube 203 to extend upward in the stacked direction of the wafers 200. Specifically, each of the nozzles 249a and 249b is installed along a wafer arrangement region, where the wafers 200 are arranged, and in a region that horizontally surrounds the wafer arrangement region at a side of the wafer arrangement region. Each of the nozzles 249a and 249b is formed of an L-shaped long nozzle, and its horizontal portion is installed to penetrate a lower sidewall of the manifold 209 while its vertical portion is installed to ascend at least from one end portion to the other end portion of the wafer arrangement region. A plurality of gas supply holes 250a and 250b, through which gas is supplied, is formed on side surfaces of the nozzles 249a and 249b, respectively. The gas supply holes 250a and 250b are opened toward a center of the reaction tube 203 to allow the gas to be supplied toward the wafers 200. The plurality of gas supply holes 250a and 250b may have the same opening area and may be disposed over a space from a lower portion to an upper portion of the reaction tube 203 with the same opening pitch.

As described above, in this embodiment, the gas is transferred via the nozzles 249a and 249b, which are disposed in a vertically extending annular space, i.e., a cylindrical space formed between the inner wall of the reaction tube 203 and the end portions of the stacked wafers 200. The gas is first ejected into the reaction tube 203 near the wafers 200 through each of the opened gas supply holes 250a and 250b of the nozzles 249a and 249b. Accordingly, the gas supplied into the reaction tube 203 mainly flows in a direction parallel to surfaces of the wafers 200, i.e., in a horizontal direction. According to the above configurations, the gas can be uniformly supplied to the respective wafers 200, thereby improving uniformity of a thickness of a film formed on the surface of each of the wafers 200. The gas flowing on the surfaces of the wafers 200, i.e., residual gas after reaction, flows toward an exhaust port, i.e., an exhaust pipe 231, which will be described later. However, a flow direction of the residual gas is not limited to a vertical direction, but may be suitably adjusted depending on a position of the exhaust port.

A precursor gas containing a predetermined element, for example, a halosilane precursor gas containing Si and a halogen element, is supplied from the gas supply pipe 232a into the process chamber 201 through the MFC 241a, the valve 243a, and the nozzle 249a.

The halosilane precursor gas may include a halosilane precursor in a gaseous state, for example, a gas obtained by vaporizing a halosilane precursor that is in a liquid state under normal temperature and pressure, a halosilane precursor that is in a gaseous state under normal temperature and pressure, or the like. The halosilane precursor may include a silane precursor having a halogen group. Examples of the halogen group may include a chloro group, a fluoro group, a bromo group, an iodine group, or the like. As such, the halogen group contains a halogen element such as chlorine (Cl), fluorine (F), bromine (Br), iodine (I), or the like. The halosilane precursor may refer to a kind of halide. As used herein, the term "precursor" may refer to "a precursor liquid in a liquid state," "a precursor gas in a gaseous state," or both.

For example, a precursor gas containing Si and Cl such as a chlorosilane precursor gas may be used as the halosilane precursor gas. Hexachlorodisilane ($Si_2Cl_6$, abbreviation: HCDS) gas may be used as the chlorosilane precursor gas. When a precursor liquid in a liquid state under normal temperature and pressure such as HCDS is used, the precursor liquid is vaporized by a vaporization system, such as a vaporizer or a bubbler, and then supplied as a precursor gas (e.g., HCDS gas).

A reaction gas, for example, a carbon (C)-containing gas, which is different in chemical structure (e.g., molecular structure) from the precursor gas, is supplied from the gas supply pipe 232b into the process chamber 201 via the MFC 241b, the valve 243b, and the nozzle 249b. An example of the carbon-containing gas may include a hydrogen carbide-based gas. The hydrogen carbide-based gas may refer to a material consisting of only two elements of C and H and acts as a C source in a substrate processing procedure, which will be described later. For example, propylene ($C_3H_6$) gas may be used as the hydrogen carbide-based gas.

A reaction gas, for example, an oxygen (O)-containing gas, which is different in chemical structure from the precursor gas, is also supplied from the gas supply pipe 232b into the process chamber 201 via the MFC 241b, the valve 243b, and the nozzle 249b. The oxygen-containing gas acts as an oxidizing gas, i.e., an O source, in the substrate processing procedure, which will be described later. For example, oxygen ($O_2$) gas may be used as the oxygen-containing gas.

A reaction gas, for example, a nitrogen (N)-containing gas, which is different in chemical structure from the precursor gas, is also supplied from the gas supply pipe 232b into the process chamber 201 via the MFC 241b, the valve 243b, and the nozzle 249b. An example of the nitrogen-containing gas may include a hydrogen nitride-based gas. The hydrogen nitride-based gas may refer to a material consisting of only two elements of N and H and acts as a nitriding gas, i.e., a N source, in the substrate processing procedure, which will be described later. For example, ammonia ($NH_3$) gas may be used as the hydrogen nitride-based gas.

A reaction gas, for example, a boron (B)-containing gas, which is different in chemical structure from the precursor gas, is also supplied from the gas supply pipe 232b into the process chamber 201 via the MFC 241b, the valve 243b, and the nozzle 249b. An example of the boron-containing gas may include a borane-based gas. The borane-based gas may refer to a borane compound in a gaseous state, for example, a gas obtained by vaporizing a borane compound that is in a liquid state under normal temperature and pressure, a borane compound that is in a gaseous state under normal temperature and pressure, or the like. The borane compound includes a haloborane compound containing B and a halogen element, for example, a chloroborane compound containing B and Cl. The borane compound also includes borane (borohydride) such as monoborane ($BH_3$) or diborane ($B_2H_6$), or a borane compound (borane derivative) that is obtained by substituting H in borane with a different element. Such a borane-based gas acts as a B source in a substrate processing procedure, which will be described later. For example, trichloroborane ($BCl_3$) gas may be used as the borane-based gas.

A fluorine-based gas as a cleaning gas is supplied into the process chamber 201 from the gas supply pipes 232c and 232d, respectively, via the MFCs 241c and 241d, the valves 243c and 243d, the gas supply pipes 232a and 232b, and the nozzle 249a and 249b. Fluorine ($F_2$) gas may be used as the fluorine-based gas.

A reaction promoting gas that promotes etching reaction by the above-mentioned fluorine-based gas may be supplied as the cleaning gas into the process chamber 201 from the gas supply pipes 232c and 232d, respectively, via the MFCs 241c and 241d, the valves 243c and 243d, the gas supply pipes 232a and 232b, and the nozzle 249a and 249b. The reaction promoting gas is a gas which cannot perform a cleaning action by itself or performs the cleaning action a little. However, addition of the reaction promoting gas to the fluorine-based gas enhances a cleaning action by the fluorine-based gas. Hydrogen fluoride (HF) gas may be used as the reaction promoting gas.

An inert gas such as nitrogen ($N_2$) gas is supplied into the process chamber 201 from the gas supply pipes 232e and 232f, respectively, via the MFCs 241e and 241f, the valves 243e and 243f, the gas supply pipes 232a and 232b, and the nozzle 249a and 249b.

When the above-mentioned precursor gas flows from the gas supply pipe 232a, the gas supply pipe 232a, the MFC 241a, and the valve 243a mainly constitute a precursor gas supply system. The precursor gas supply system may include the nozzle 249a. The precursor gas supply system may be also referred to as a precursor supply system. When the halosilane precursor gas flows from the gas supply pipe 232a, the precursor gas supply system may also be referred to as a halosilane precursor gas supply system or a halosilane precursor supply system.

When the carbon-containing gas is supplied from the gas supply pipe 232b, the gas supply pipe 232b, the MFC 241b, and the valve 243b mainly constitute a carbon-containing gas supply system. The carbon-containing gas supply system may include the nozzle 249b. When the hydrogen carbide-based gas is supplied from the gas supply pipe 232b, the carbon-containing gas supply system may also be referred to as a hydrogen carbide-based gas supply system or a hydrogen carbide supply system.

When the oxygen-containing gas is supplied from the gas supply pipe 232b, the gas supply pipe 232b, the MFC 241b, and the valve 243b mainly constitute an oxygen-containing gas supply system. The oxygen-containing gas supply system may include the nozzle 249b. The oxygen-containing gas supply system may also be referred to as an oxidizing gas supply system or an oxidizing agent supply system.

When the nitrogen-containing gas is supplied from the gas supply pipe 232b, the gas supply pipe 232b, the MFC 241b, and the valve 243b mainly constitute a nitrogen-containing gas supply system. The nitrogen-containing gas supply system may include the nozzle 249b. The nitrogen-containing gas supply system may also be referred to as a nitriding gas supply system or a nitriding agent supply system. When the hydrogen nitride-based gas flows from the gas supply pipe 232b, the nitrogen-containing gas supply system may also be referred to as a hydrogen nitride-based gas supply system or a hydrogen nitride supply system.

When the boron-containing gas is supplied from the gas supply pipe 232b, the gas supply pipe 232b, the MFC 241b, and the valve 243b mainly constitute a boron-containing gas supply system. The boron-containing gas supply system may include the nozzle 249b. When the borane-based gas flows from the gas supply pipe 232b, the boron-containing gas supply system may also be referred to as a borane-based gas supply system or a borane compound supply system.

One or all of the above-mentioned carbon-containing gas supply system, oxygen-containing gas supply system, nitrogen-containing gas supply system, and boron-containing gas supply system may also be referred to as a reaction gas supply system or a reactant supply system.

One or both of the above-mentioned precursor gas supply system and reaction gas supply system may also be referred to as a process gas supply system. Various kinds of gases supplied from the precursor gas supply system or various kinds of gases supplied from the reaction gas supply system may also be referred to as process gases.

When the fluorine-based gas is supplied from the gas supply pipe 232c, a fluorine-based gas supply system is mainly constituted by the gas supply pipe 232c, the MFC 241c, and the valve 243c. The fluorine-based gas supply system may include a portion of the nozzle 249a positioned at a downstream side of a position where the gas supply pipe 232a is connected with the gas supply pipe 232c. When the fluorine-based gas is supplied from the gas supply pipe 232d, another fluorine-based gas supply system is mainly constituted by the gas supply pipe 232d, the MFC 241d, and the valve 243d. The fluorine-based gas supply system may include a portion of the nozzle 249b at a downstream side of a position where the gas supply pipe 232b is connected with the gas supply pipe 232d.

When the reaction promoting gas is supplied from the gas supply pipe 232c, a reaction promoting gas supply system is mainly constituted by the gas supply pipe 232c, the MFC 241c, and the valve 243c. The reaction promoting gas supply system may include the portion of the nozzle 249a at the downstream side of the position where the gas supply pipe 232a is connected with the gas supply pipe 232c. Further, when the reaction promoting gas is supplied from the gas supply pipe 232d, another reaction promoting gas supply system is mainly constituted by the gas supply pipe 232d, the MFC 241d, and the valve 243d. The reaction promoting gas supply system may include the portion of the nozzle 249b at the downstream side of the position where the gas supply pipe 232b is connected with the gas supply pipe 232d.

One or both of the above-mentioned fluorine-based gas supply system and reaction promoting gas supply system may also be referred to as a cleaning gas supply system.

An inert gas supply system is mainly constituted by the gas supply pipes 232e and 232f, the MFCs 241e and 241f and the valves 243e and 243f. The inert gas supply system may also be referred to as a purge gas supply system, a dilution gas supply system, or a carrier gas supply system. The inert gas supplied from the gas supply pipes 232e and 232f acts as a cooling gas for cooling the exhaust pipe 231, which will be described later, in a cleaning process which will be described later. Therefore, the inert gas supply system may also be referred to as a cooling gas supply system.

The exhaust pipe 231 for exhausting the internal atmosphere of the process chamber 201 is connected to the reaction tube 203. A pressure sensor 245, which is a pressure detector (or a pressure detecting part) for detecting an internal pressure in the process chamber 201, an APC (Auto Pressure Controller) valve 244, which is a pressure regulator (or a pressure adjusting part), and a vacuum pump 246 as a vacuum exhaust device are connected to the exhaust pipe 231. The APC valve 244 is configured to start and stop vacuum-exhausting the process chamber 201 by opening and closing a valve when the vacuum pump 246 is in operation, and further to adjust the internal pressure of the process chamber 201 by adjusting a degree of valve opening based on pressure information detected by the pressure sensor 245 when the vacuum pump 246 is in operation. The APC valve 244 may also be referred to as an exhaust valve. An exhaust system is mainly constituted by the exhaust pipe 231, the APC valve 244, and the pressure sensor 245. The exhaust system may also include the vacuum pump 246. The exhaust pipe 231 is not limited to being connected to the reaction tube 203 but may be connected to the manifold 209, like the case of the nozzles 249a and 249b.

The exhaust pipe 231 is made of an alloy having high heat resistance and corrosion resistance. Examples of the alloy may appropriately include Hastelloy® having high heat resistance and corrosion resistance that may be obtained by adding iron (F), molybdenum (Mo), chromium (Cr), or the like to nickel (Ni); Inconel® having high heat resistance and corrosion resistance that may be obtained by adding F, Cr, niobium (Nb), Mo, or the like to Ni; and the like, as well as SUS. A temperature sensor 231a as a temperature detector for measuring a temperature of the exhaust pipe 231 is connected to the exhaust pipe 231.

A seal cap 219 serving as a lid for a furnace opening, which is configured to hermetically seal a lower end opening of the manifold 209, is installed under the manifold 209. The seal cap 219 is configured to contact the lower end of the manifold 209 from the lower side of the manifold 209 in a vertical direction. The seal cap 219 is made of, for example, metal such as stainless steel (SUS) and has a disc shape. An O-ring 220b, which is a seal member in contact with the lower end portion of the manifold 209, is positioned on an upper surface of the seal cap 219. A rotary mechanism 267 configured to rotate the boat 217, which will be described later, is installed to a side of the seal cap 219 opposite to the process chamber 201. A rotary shaft 255 of the rotary mechanism 267 extends through the seal cap 219 and is connected to the boat 217. The rotary mechanism 267 is configured to rotate the wafers 200 by rotating the boat 217. The seal cap 219 is configured to be vertically moved by a boat elevator 115, which is an elevation mechanism vertically disposed outside the reaction tube 203. The boat elevator 115 is configured to load and unload the boat 217 into and from the process chamber 201 by elevating and lowering the seal cap 219. As such, the boat elevator 115 is configured as a transfer device (or a transfer mechanism) that transfers the boat 217 and the wafers 200 supported by the boat 217 into and out of the process chamber 201.

The boat 217, which is used as a substrate support, is configured to support a plurality of wafers 200, e.g., 25 to 200 sheets, in a state where the wafers 200 are horizontally-positioned and vertically stacked in multiple stages, i.e., separated from each other, and the centers of the wafers 200 are aligned with each other. The boat 217 is made of, for example, heat resistant material such as quartz or silicon carbide (SiC). Heat insulating plates 218 made of, for example, heat resistant material such as quartz or silicon carbide (SiC) are stacked in multiple stages, in a horizontal posture, at a lower portion of the boat 217. With the above configuration, transfer of heat from the heater 207 to the seal cap 219 is hindered. However, this embodiment is not limited as above. Instead of installing the heat insulating plates 218 to the lower portion of the boat 217, a heat insulating tube formed of a tubular member made of heat resistant material such as quartz or SiC may be installed.

A temperature sensor 263, which is a temperature detector, is installed in the reaction tube 203. A condition of current applying to the heater 207 is adjusted based on temperature information, detected by the temperature sensor 263, such that an interior of the process chamber 201 has a desired temperature distribution. The temperature sensor 263 has an L-shaped configuration, like the nozzles 249a and 249b, and is installed along the inner wall of the reaction tube 203.

Figure 3:
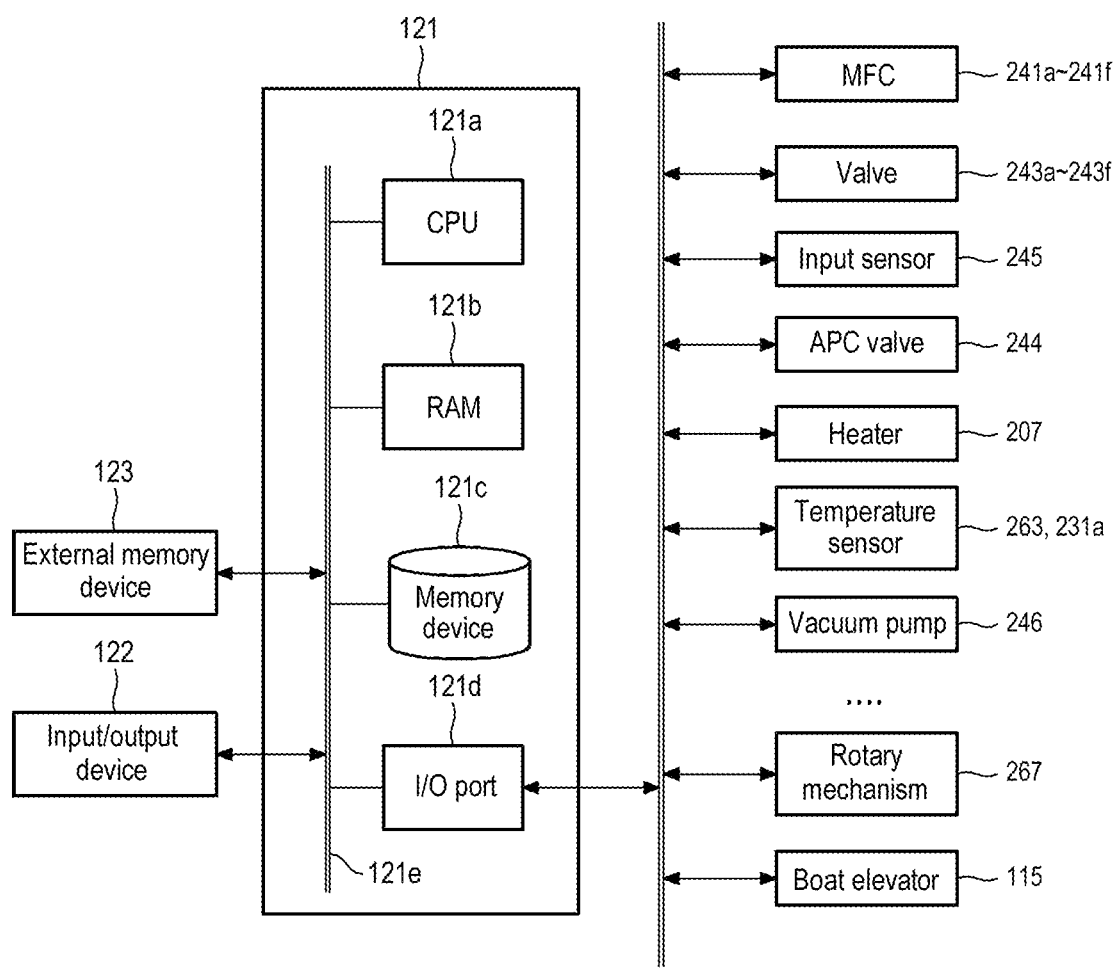
FIG. 3 is a schematic view illustrating a configuration of a controller of the substrate processing apparatus suitably used in the embodiment of the present disclosure, in which a control system of the controller is shown in a block diagram.

As illustrated in FIG. 3, a controller 121 serving as a control unit (or a control part) is configured as a computer including a CPU (Central Processing Unit) 121a, a RAM (Random Access Memory) 121b, a memory device 121c, and an I/O port 121d. The RAM 121b, the memory device 121c, and the I/O port 121d are configured to exchange data with the CPU 121a via an internal bus 121e. An input/output device 122 configured as, for example, a touch panel or the like, is connected to the controller 121.

The memory device 121c is configured with, for example, a flash memory, an HDD (Hard Disk Drive), or the like. A control program for controlling operations of the substrate processing apparatus, a processing recipe in which a sequence or a condition for a substrate process to be described later is written, and a cleaning recipe in which a sequence or a condition for a cleaning process to be described later is written are readably stored in the memory device 121c. The processing recipe, which is a combination of sequences, causes the controller 121 to execute each sequence in a procedure of the substrate process, which will be described later, in order to obtain a predetermined result, and functions as a program. The cleaning recipe, which is a combination of sequences, causes the controller 121 to execute each sequence in the cleaning process to be described later in order to obtain a predetermined result, and functions as a program. Hereinafter, the processing recipe, the cleaning recipe, and the control program may be collectively referred to as a program. As used herein, the term "program" may include the case in which only one of the processing recipe, the cleaning recipe, and the control program is included, or the case in which any combination of the processing recipe, the cleaning recipe, and the control program is included. The RAM 121b is configured as a memory area (or a work area) in which a program or data read by the CPU 121a is temporarily stored.

The I/O port 121d is connected to the above-described MFCs 241a to 241f, the valves 243a to 243f, the pressure sensor 245, the APC valve 244, the vacuum pump 246, the heater 207, the temperature sensors 263 and 231a, the rotary mechanism 267, the boat elevator 115 and the like.

The CPU 121a is configured to read and execute the control program from the memory device 121c. According to an input of an operation command from the input/output device 122, the CPU 121a reads the processing recipe from the memory device 121c. The CPU 121a is configured to control flow rate controlling operation of the MFCs 241a to 241f for various types of gases, opening/closing operation of the valves 243a to 243f, opening/closing operation of the APC valve 244, pressure adjusting operation of the APC valve 244 based on the pressure sensor 245, start and stop operation of the vacuum pump 246, temperature adjusting operation of the heater 207 based on the temperature sensor 263, rotation and rotation speed adjusting operation of the rotary mechanism 267 for the boat 217, elevation operation of the boat elevator 115 for the boat 217, and the like, according to contents of the read processing recipe. In addition, the CPU 121a is configured to control progress of the cleaning process, which will be described later, based on the temperature information detected by the temperature sensor 231a.

The controller 121 is not limited to being configured as a dedicated computer but may be configured as a general-purpose computer. For example, the controller 121 of this embodiment may be configured by preparing an external memory device 123 (for example, a magnetic tape, a magnetic disc such as a flexible disc or a hard disk, an optical disc such as a CD or DVD, a magneto-optical disc such as an MO, a semiconductor memory such as a USB memory or a memory card), in which a program is stored, and installing the program on the general-purpose computer using the external memory device 123. Means for supplying the program to the computer is not limited to the case in which the program is supplied through the external memory device 123. For example, the program may be supplied using communication means such as the Internet or a dedicated line, rather than via the external memory device 123. The memory device 121*c* or the external memory device 123 is configured as a non-transitory computer-readable recording medium. Hereinafter, the means for supplying the program will be simply referred to as "a recording medium." As used herein, "recording medium" may include only the memory device 121*c*, only the external memory device 123, or both of the memory device 121*c* and the external memory device 123.

(2) Film Forming Process

Next, an example of a sequence of forming a film on a substrate, which is one of the procedures for manufacturing a semiconductor device using the above-described substrate processing apparatus, will be described with reference to FIG. 4. In the following description, operations of various parts constituting the substrate processing apparatus are controlled by the controller 121.

Figure 4:
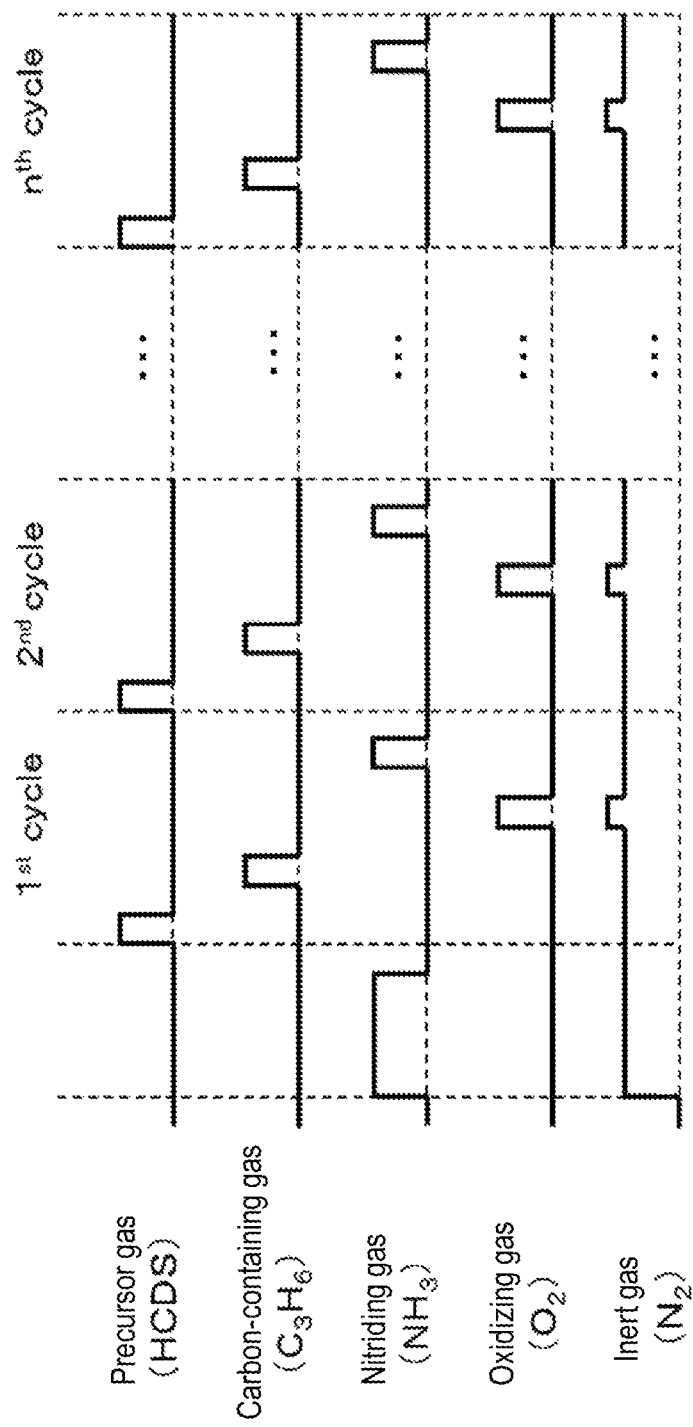
FIG. 4 is a view illustrating gas supply timings in a film forming sequence according to an embodiment of the present disclosure.

In the film forming sequence shown in FIG. 4, a silicon oxycarbonitride film (SiOCN film) containing Si, O, C, and N is formed on the wafer 200 as a substrate by pre-processing a surface of the wafer 200 by supplying $NH_3$ gas as a nitriding gas onto the wafer 200; and then performing a cycle a predetermined number of times, the cycle including supplying HCDS gas as a precursor gas onto the wafer 200 (Step 1); supplying $C_3H_6$ gas as a carbon-containing gas onto the wafer 200 (Step 2); supplying $O_2$ gas as an oxidizing gas onto the wafer 200 (Step S3); and supplying $NH_3$ gas as a nitriding gas onto the wafer 200 (Step 4).

Here, the case where the cycle in which Step 1 to Step 4 are not performed simultaneously, that is, Step 1 to Step 4 are performed sequentially and asynchronously, is performed a predetermined number of times (e.g., n times) will be described as an example. In this embodiment, "performing a cycle a predetermined number of times" refers to performing a cycle one or more times, which means performing the cycle once or more than once. FIG. 4 illustrates an example of repeating the cycle n times.

In the present disclosure, the film forming sequence may be sometimes expressed as follows.

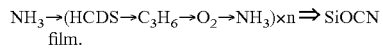
film.

In the present disclosure, the term "a wafer" may be used for referring to not only a wafer per se but also a laminated body (or aggregate) of a wafer and certain layers or films formed on a surface of the wafer (that is, a wafer including certain layers or films formed on a surface of the wafer is sometimes referred to as a "wafer"). In the present disclosure, the term "a surface of a wafer" may mean a surface (or exposed surface) of a wafer per se, or a surface of a specified layer or film formed on the wafer, namely an outermost surface of the wafer as a laminated body.

In the present disclosure, the expression "supplying a specified gas to a wafer" may mean that the specified gas is directly supplied to a surface (or exposed surface) of a wafer per se, or that the specified gas is supplied to a surface of a certain layer or film formed on the wafer, namely to an outermost surface of the wafer as a laminated body. In the present disclosure, the expression "forming a certain layer (or film) on a wafer" may mean that the certain layer (or film) is directly formed on the surface (or exposed surface) of the wafer per se, or that the certain layer (or film) is formed on the surface of a certain layer or film formed on the wafer, namely on an outermost surface of the wafer as a laminated body.

In the present disclosure, the term "substrate" is interchangeably used with the term "wafer." Thus, with regard to the aforementioned description, the term "wafer" may be replaced with the term "substrate."

(Wafer Charging and Boat Loading)

When a plurality of wafers 200 are charged on the boat 217 (i.e., wafer charging), as illustrated in FIG. 1, the boat 217 holding the plurality of wafers 200 is lifted up by the boat elevator 115 to be loaded into the process chamber 201 (i.e., boat loading). In this state, the seal cap 219 seals the lower end portion of the manifold 209 via the O-ring 220*b*.

(Pressure Adjustment and Temperature Adjustment)

The interior of the process chamber 201 (i.e., the space in which the wafers 200 exist) is evacuated (or depressurized) by the vacuum pump 246 to reach a desired pressure (or vacuum level). Here, the internal pressure of the process chamber 201 is measured by the pressure sensor 245 and the APC valve 244 is feedback-controlled based on the measured pressure information. The vacuum pump 246 is always kept in an operative state at least until a process on the wafers 200 is terminated.

Further, the wafers 200 within the process chamber 201 are heated by the heater 207 to a desired film forming temperature. Here, a condition for applying current to the heater 207 is feedback-controlled based on the temperature information detected by the temperature sensor 263 in order to keep a desired temperature distribution in the interior of the process chamber 201. When the wafers 200 in the process chamber 201 are heated to the film forming temperature, the inner wall of the reaction tube 203, surfaces and interiors of the nozzles 249*a* and 249*b*, surface of the boat 217, and so on are also heated to the film forming temperature. The heating of the interior of the process chamber 201 by the heater 207 is continuously performed at least until a process on the wafers 200 is terminated.

Further, the boat 217 and the wafers 200 begin to rotate by the rotary mechanism 267. The rotation of the boat 217 and wafers 200 by the rotary mechanism 267 is continuously performed at least until a process on the wafers 200 is terminated.

(SiOCN Film Forming Procedure)

Subsequently, a surface modifying step, which will be described below, is executed and the following four steps, i.e., Steps 1 to 4, are then executed sequentially.

[Surface Modifying Step]

(Supply of $NH_3$ Gas)

In this step, the valve 243*b* is opened to flow $NH_3$ gas into the gas supply pipe 232*b*. A flow rate of the $NH_3$ gas is controlled by the MFC 241*b*, and the $NH_3$ gas is supplied from the nozzle 249*b* heated to the film forming temperature into the process chamber 201 and is exhausted through the exhaust pipe 231. In this operation, the $NH_3$ gas activated with heat is supplied to the wafer 200. In addition, the valve 243*f* is opened to flow $N_2$ gas into the gas supply pipe 232*f*. The $N_2$ gas flowing into the gas supply pipe 232*f* is supplied into the process chamber 201 together with the $NH_3$ gas and is exhausted through the exhaust pipe 231.

Further, in order to prevent infiltration of the $NH_3$ gas into the nozzles 249*a*, the valve 243*e* is opened to flow $N_2$ gas into the gas supply pipe 232*e*. The $N_2$ gas is supplied into the process chamber 201 through the gas supply pipe 232*a* and the nozzle 249*a* and is exhausted through the exhaust pipe 231.

In this operation, the APC valve 244 is appropriately controlled to set the internal pressure of the process chamber 201 to fall within a range of, for example, 1 to 6,000 Pa. A supply flow rate of the $NH_3$ gas controlled by the MFC 241b is set to fall within a range of, for example, 100 to 10,000 sccm. A supply flow rate of the $N_2$ gas controlled by each of the MFC 241e and 241f is set to fall within a range of, for example, 100 to 10,000 sccm. A partial pressure of the $NH_3$ gas in the process chamber 201 is set to fall within a range of, for example, 0.01 to 5,941 Pa. A time period for which the $NH_3$ gas is supplied to the wafer 200, i.e., a gas supply time period (or an irradiation time period), may fall within a range of, for example, 1 to 600 seconds. The temperature of the heater 207 may be set such that a temperature of the wafer 200 may fall within a range, e.g., from 250 to 700 degrees C., in some embodiments, from 300 to 650 degrees C. and, in some embodiments, from 350 to 600 degrees C. The $NH_3$ gas is thermally activated under the above-mentioned conditions. Supplying the $NH_3$ gas activated with heat can cause soft reaction to provide soft surface modification, which will be described below.

By supplying the activated $NH_3$ gas onto an outermost surface of the wafer 200 (e.g., an underlying surface for use in forming the SiOCN film), the outermost surface of the wafer 200 is modified. In this operation, the outermost surface of the wafer 200 is nitrided, $NH_3$ is adsorbed on the outermost surface of the wafer 200, or both of the above reactions occur. HCDS can be easily adsorbed on the modified outermost surface of the wafer 200 and Si can be easily deposited on the modified outermost surface of the wafer 200 in Step 1, which will be described later. As such, the $NH_3$ gas used in the surface modifying step acts as an adsorption and deposition promoting gas for promoting adsorption and deposition of HCDS and Si on the outermost surface of the wafer 200.

(Residual Gas Removal)

After the surface modification is completed, the valve 243b is closed to stop the supply of the $NH_3$ gas. In this operation, with the APC valve 244 opened, the interior of the process chamber 201 is evacuated by the vacuum pump 246 to remove residual gas remaining in the process chamber 201, such as the $NH_3$ gas which has not reacted or remains after contributing to the surface modification, out of the process chamber 201. In this operation, the supply of the $N_2$ gas into the process chamber 201 is maintained by keeping the valves 243e and 243f in an open state. The $N_2$ gas acts as a purge gas, and thus, the residual gas remaining in the process chamber 201 can be effectively removed from the process chamber 201.

In this operation, the residual gas remaining in the process chamber 201 may not be removed completely and the interior of the process chamber 201 may not be purged completely. When the residual gas remaining in the process chamber 201 is very small in amount, there may be no harmful effect on subsequent Step 1. Here, a flow rate of the $N_2$ gas supplied into the process chamber 201 need not be high. For example, if approximately the same amount of the $N_2$ gas as the volume of the reaction tube 203 (or the process chamber 201) is supplied, the purging process can be performed without a harmful effect on Step 1. In this manner, since the interior of the process chamber 201 is not purged completely, a purging time period can be reduced and throughput can be improved. In addition, consumption of the $N_2$ gas can be restricted to a required minimal amount.

Examples of the nitrogen-containing gas may include hydrogen nitride-based gases such as diazene ($N_2H_2$) gas, hydrazine ($N_2H_4$) gas, $N_3H_8$ gas, and the like, and gases containing compounds thereof, in addition to the $NH_3$ gas. Examples of the inert gas may include rare gases such as Ar gas, He gas, Ne gas, Xe gas, and the like, in addition to the $N_2$ gas.

[Step 1]

(Supply of HCDS Gas)

After the surface modifying step is terminated, HCDS gas is supplied onto the wafer 200 in the process chamber 201.

The control for opening and closing the valves 243a, 243e, and 243f in Step 1 is performed using the same procedure as the control for opening and closing the valves 243b, 243e, and 243f in the surface modifying step. The HCDS gas is supplied from the nozzle 249a heated to the film forming temperature into the process chamber 201. A supply flow rate of the HCDS gas controlled by the MFC 241a ranges, for example, from 1 to 2,000 sccm and, in some embodiments, 10 to 1,000 sccm. The internal pressure of the process chamber 201 ranges, for example, from 1 to 4,000 Pa, in some embodiments, 67 to 2,666 Pa and, in some embodiments, 133 to 1,333 Pa. A time period for which the HCDS gas is supplied to the wafer 200, i.e., a gas supply time period (or an irradiation time period), may fall within a range of, for example, 1 to 120 seconds and, in some embodiments, 1 to 60 seconds. The temperature of the heater 207 may be set such that the temperature of the wafer 200 may fall within a range, e.g., from 250 to 700 degrees C., in some embodiments, from 300 to 650 degrees C. and, in some embodiments, from 350 to 600 degrees C.

If the temperature of the wafer 200 is lower than 250 degrees C., it may be difficult for HCDS to be chemically adsorbed onto the wafer 200, which may result in a failure in obtaining a practical film forming rate. This can be resolved by setting the temperature of the wafer 200 to 250 degrees C. or higher. By setting the temperature of the wafer 200 to 300 degrees C. or higher, or further 350 degrees C. or higher, HCDS can be more sufficiently adsorbed onto the wafer 200, thereby obtaining a more sufficient film forming rate.

If the temperature of the wafer 200 exceeds 700 degrees C., CVD reaction is strengthened to cause excessive gaseous reaction and film thickness uniformity is easily deteriorated, which may result in difficulty in controlling the uniformity. If the temperature of the wafer 200 is set to 700 degrees C. or lower, the deterioration of film thickness uniformity can be prevented and the control of the uniformity can be facilitated. In particular, if the temperature of the wafer 200 is set to 650 degrees C. or lower, or further 600 degrees C. or lower, surface reaction becomes predominant over the gaseous reaction, resulting in that the film thickness uniformity can be easily secured and the film thickness uniformity can be controlled easily.

Accordingly, the temperature of the wafer 200 may be set to fall within a range of 250 to 700 degrees C., in some embodiments, 300 to 650 degrees C., and in some embodiments, 350 to 600 degrees C.

Other process conditions are the same as those in the surface modifying step.

Under the foregoing conditions, the HCDS gas is supplied onto the wafer 200 to form a Si-containing layer, as a first layer, which contains Cl and has a thickness ranging, e.g., from less than one atomic layer to several atomic layers, on the outermost surface of the wafer 200. The Si-containing layer containing Cl may include either or both of a silicon layer containing Cl and an HCDC adsorption layer. The HCDS adsorption layer may include a physical adsorption layer of HCDS, a chemical adsorption layer of HCDS, or both.

Here, a layer having a thickness smaller than one atomic layer refers to an atomic layer which is discontinuously formed, and a layer having a thickness equal to one atomic layer refers to an atomic layer which is continuously formed. Also, a layer having a thickness smaller than one molecular layer refers to a molecular layer which is discontinuously formed, and a layer having a thickness equal to one molecular layer refers to a molecular layer which is continuously formed. Further, the Si-containing layer containing Cl may include both the Cl-containing Si layer and the HCDS adsorption layer. However, as described above, the Si-containing layer containing Cl will be represented by the expression of "one atomic layer," "several atomic layers," or the like.

Under a condition in which the HCDS gas is self-decomposed (i.e., pyrolyzed), that is, under a condition in which pyrolysis reaction of the HCDS gas occurs, Si is deposited on the wafer 200 to form the Cl-containing Si layer. Under a condition in which the HCDS gas is not self-decomposed (i.e., not pyrolyzed), that is, under a condition in which pyrolysis reaction of the HCDS gas does not occur, HCDS is adsorbed onto the wafer 200 to form the HCDS adsorption layer. In some embodiments, forming the Cl-containing Si layer on the wafer 200 is more desirable than forming the HCDS adsorption layer on the wafer 200, in order to secure a higher film forming rate.

When the thickness of the first layer exceeds several atomic layers, modification reaction in Steps 3 and 4, which will be described later, does not affect the entire first layer. In addition, a minimum value of the thickness of the first layer is less than one atomic layer. Accordingly, the thickness of the first layer ranges from less than one atomic layer to several atomic layers in some embodiments. When the thickness of the first layer is one atomic layer or less, i.e., one atomic layer or less than one atomic layer, the effect of the modification reaction in Steps 3 and 4, which will be described later, can be increased comparatively and a time period required for the modification reaction in Steps 3 and 4 can be reduced. A time period required for forming the first layer in Step 1 can also be reduced. As a result, a processing time period per one cycle can be reduced and a total processing time period can also be reduced. As a result, the film forming rate can be increased. In addition, when the thickness of the first layer is one atomic layer or less, it may become easier to control the film thickness uniformity.

(Residual Gas Removal)

After the first layer is formed, the valve 243a is closed to stop the supply of the HCDS gas. Then, according to the same procedure as the surface modifying step, residual gas remaining in the process chamber 201, such as the HCDS gas which has not reacted or remains after contributing to the formation of the Si-containing layer containing Cl, and reaction byproducts are removed out of the process chamber 201. In this operation, like the surface modifying step, the residual gas remaining in the process chamber 201 may not be removed completely.

Examples of the precursor gas may include an inorganic precursor gas such as dichlorosilane ($SiH_2Cl_2$, abbreviation: DCS) gas, monochlorosilane ($SiH_3Cl$, abbreviation: MCS) gas, tetrachlorosilane, i.e., silicon tetrachloride ($SiCl_4$, abbreviation: STC) gas, trichlorosilane ($SiHCl_3$, abbreviation: TCS) gas, trisilane ($Si_3H_8$, abbreviation: TS) gas, disilane ($Si_2H_6$, abbreviation: DS) gas, monosilane($SiH_4$, abbreviation: MS) gas, or the like, and an organic precursor gas such as tetrakis(dimethylamino)silane ($Si[N(CH_3)_2]_4$, abbreviation: 4DMAS) gas, tris(dimethylamino)silane ($Si[N(CH_3)_2]_3H$, abbreviation: 3DMAS) gas, bis(diethylamino)silane ($Si[N(C_2H_5)_2]_2H_2$, abbreviation: 2DEAS) gas, bis(tert-butylamino)silane ($SiH_2[NH(C_4H_9)]_2$, abbreviation: BTBAS) gas, or the like, in addition to the HCDS gas.

Examples of the inert gas may include rare gases such as Ar gas, He gas, Ne gas, Xe gas, and the like, in addition to the $N_2$ gas.

[Step 2]

(Supply of $C_3H_6$ Gas)

After Step 1 is terminated, $C_3H_6$ gas activated with heat is supplied onto the wafer 200 in the process chamber 201.

In this step, opening and closing of the valves 243b, 243e and 243f is controlled in the same manner as opening and closing of the valves 243b, 243e and 243f in the surface modifying step. The $C_3H_6$ gas is supplied into the process chamber 201 via the gas supply pipe 232b and the nozzle 249b heated to the film forming temperature. A supply flow rate of the $C_3H_6$ gas controlled by the MFC 241b is set to fall within a range of, for example, 100 to 10,000 sccm. The internal pressure of the process chamber 201 is set to fall within a range of, for example, 1 to 6,000 Pa. A partial pressure of the $C_3H_6$ gas in the process chamber 201 is set to fall within a range of, for example, 0.01 to 5,941 Pa. A time period for which the $C_3H_6$ gas is supplied to the wafer 200, i.e., a gas supply time period (or an irradiation time period), may fall within a range of, for example, 1 to 200 seconds, in some embodiments, 1 to 120 seconds, and in some embodiments, 1 to 60 seconds. Other processing conditions are the same as those of the surface modifying step. The $C_3H_6$ gas is thermally activated under the foregoing conditions. Supplying the thermally activated $C_3H_6$ gas can cause soft reaction which facilitates formation of a carbon-containing layer which will be described later.

In this operation, the gas flowing into the process chamber 201 is the thermally activated $C_3H_6$ gas, and HCDS gas does not flow into the process chamber 201. Accordingly, the activated $C_3H_6$ gas is supplied onto the wafer 200 without causing gaseous reaction. As a result, a carbon (C)-containing layer is formed on the first layer (i.e., the Si-containing layer containing Cl) formed on the wafer 200 in Step 1. The C-containing layer may include a C layer, a chemical adsorption layer of $C_3H_6$, or both. The C-containing layer is a layer having a thickness less than one molecular layer or less than one atomic layer, i.e., a discontinuous layer. As such, a second layer containing Si and C is formed on the outermost surface of the wafer 200. The second layer includes the Si-containing layer containing Cl and the C-containing layer.

The C-containing layer need be a discontinuous layer. If the C-containing layer is a continuous layer, a surface of the Si-containing layer containing Cl is entirely covered by the C-containing layer. In this case, no Si exists on the surface of the second layer, which may result in difficulty in causing oxidation reaction of the second layer in Step 3, which will be described later, and nitridation reaction of a third layer in Step 4, which will be described later. This is because N or O can be bonded to Si, but it is difficult for N or O to be bonded to C under the foregoing conditions. In order to cause the oxidation reaction and the nitridation reaction intended in Step 3 and Step 4 which will be described later, there is a need to make adsorption of the C-containing layer on the Si-containing layer containing Cl unsaturated and make Si exposed on the surface of the second layer.

(Residual Gas Removal)

After the second layer is formed, the valve 243b is closed to stop the supply of the $C_3H_6$ gas. Then, according to the same procedure as the surface modifying step, residual gas remaining in the process chamber 201, such as the $C_3H_6$ gas which has not reacted or remains after contributing to the formation of the C-containing layer, and reaction byproducts are removed out of the process chamber 201. In this operation, like the surface modifying step, the residual gas remaining in the process chamber 201 may not be removed completely.

Examples of the carbon-containing gas may include hydrogen carbide-based gases such as acetylene ($C_2H_2$) gas and ethylene ($C_2H_4$) gas, in addition to the $C_3H_6$ gas. Examples of the inert gas may include rare gases such as Ar gas, He gas, Ne gas, Xe gas, and the like, in addition to the $N_2$ gas.

[Step 3]
(Supply of $O_2$ Gas)

After Step 2 is terminated, $O_2$ gas activated with heat is supplied onto the wafer 200 in the process chamber 201.

In this step, opening and closing of the valves 243b, 243e, and 243f is controlled in the same manner as opening and closing of the valves 243b, 243e and 243f in the surface modifying step. The $O_2$ gas is supplied into the process chamber 201 via the gas supply pipe 232b and the nozzle 249b heated to the film forming temperature. A supply flow rate of the $O_2$ gas controlled by the MFC 241b is set to fall within a range of, for example, 100 to 10,000 sccm. The internal pressure of the process chamber 201 is set to fall within a range of, for example, 1 to 6,000 Pa. A partial pressure of the $O_2$ gas in the process chamber 201 is set to fall within a range of, for example, 0.01 to 5,941 Pa. A time period for which the $O_2$ gas is supplied to the wafer 200, i.e., a gas supply time period (or an irradiation time period), may fall within a range of, for example, 1 to 120 seconds, and in some embodiments, 1 to 60 seconds. Other processing conditions are the same as those of the surface modifying step. The $O_2$ gas is thermally activated under the foregoing conditions. Supplying the thermally activated $O_2$ gas can cause soft reaction, thereby providing soft oxidation which will be described later.

In this operation, the gas flowing into the process chamber 201 is the thermally activated $O_2$ gas, but neither the HCDS gas nor the $C_3H_6$ gas flows into the process chamber 201. Accordingly, the activated $O_2$ gas is supplied onto the wafer 200 without causing gaseous reaction. The $O_2$ gas supplied onto the wafer 200 reacts with at least a portion of the second layer containing Si and C (i.e., the layer including the Si-containing layer containing Cl and the C-containing layer) formed on the wafer 200 in Step 2. Accordingly, the second layer can be thermally oxidized under a non-plasma state and be changed (or modified) into a third layer containing Si, O, and C, i.e., a silicon oxycarbide layer (SiOC layer). In addition, when the third layer is formed, impurities such as Cl and the like contained in the second layer form gaseous material containing at least Cl during the modification reaction by the $O_2$ gas and are discharged out of the process chamber 201. As such, the impurities such as Cl and the like in the second layer are separated from the second layer as the impurities are withdrawn or desorbed out of the second layer. Accordingly, the third layer has fewer impurities such as Cl and the like than the second layer.

In this operation, the oxidation reaction of the second layer should be unsaturated. For example, when the Si-containing layer containing Cl, which has a thickness of less than several atomic layers, is formed in Step 1 and the C-containing layer having a thickness of less than one atomic layer is formed in Step 2, at least a portion of the surface layer (e.g., one atomic layer of the surface) of the second layer is oxidized. Here, the oxidation is performed under a condition where the oxidation reaction of the second layer is unsaturated so as to prevent the entire second layer from being oxidized. Although several layers below the surface layer of the second layer may be oxidized depending on conditions, it is desirable to oxidize only the surface layer since the controllability of the composition ratio of a SiOCN film to be finally formed can be improved.

In this operation, in particular, the above-mentioned process conditions may be adjusted to increase a dilution rate of the $O_2$ gas (or decrease a concentration of the $O_2$ gas), reduce a supply time period of the $O_2$ gas, or lower a partial pressure of the $O_2$ gas. Accordingly, an oxidizing power in Step 3 can be lowered and the oxidation reaction of the second layer can be more easily unsaturated. The film forming sequence of FIG. 4 illustrates a state in which the partial pressure of the $O_2$ gas is lowered and the oxidation power is also lowered by increasing the flow rate of the $N_2$ gas supplied in Step 3 over the flow rate of the $N_2$ gas supplied in other steps.

By lowering the oxidation power in Step 3, it is easier to prevent C from being desorbed from the second layer during the oxidation process. Since Si—O bonding has a higher bonding energy than Si—O bonding, the Si—O bonding is apt to be decomposed when the Si—O bonding is formed. On the contrary, by appropriately lowering the oxidation power in Step 3, the Si—O bonding can be prevented from being decomposed when the Si—O bonding is formed in the second layer, thereby making it easier to prevent C whose bonding with Si has been decomposed from being desorbed from the second layer.

In addition, by lowering the oxidation power in Step 3, Si can remain exposed on the oxidized second layer, i.e., the outermost surface of the third layer. When Si remains exposed on the outermost surface of the third layer, it is easier to nitride the outermost surface of the third layer in Step 4 which will be described later. In a state where the Si—O bonding or the Si—C bonding is formed over the entire outermost surface of the third layer and no Si is exposed on the outermost surface, Si—N bonding may be unlikely to be formed under the conditions of Step 4 which will be described later. However, Si—N bonding can be easily formed when Si remains exposed on the outermost surface of the third layer, i.e., when Si which can be bonded to N under the conditions of Step 4, which will be described later, exists on the outermost surface of the third layer.

(Residual Gas Removal)

After the third layer is formed, the valve 243b is closed to stop the supply of the $O_2$ gas. Then, according to the same procedure as the surface modifying step, residual gas remaining in the process chamber 201, such as the $O_2$ gas which has not reacted or remains after contributing to the formation of the third layer, and reaction byproducts are removed out of the process chamber 201. In this embodiment, like the surface modifying step, the residual gas remaining in the process chamber 201 may not be removed completely.

Examples of the oxidizing gas may include vapor ($H_2O$), nitrogen monoxide (NO) gas, nitrous oxide ($N_2O$) gas, nitrogen dioxide ($NO_2$) gas, carbon monoxide (CO) gas, carbon dioxide ($CO_2$) gas, ozone ($O_3$) gas, mixture of hydrogen ($H_2$) gas and $O_2$ gas, mixture of $H_2$ gas and $O_3$ gas, and other oxygen-containing gases, in addition to the $O_2$ gas. Examples of the inert gas may include rare gases such as Ar gas, He gas, Ne gas, Xe gas, and the like, in addition to the $N_2$ gas.

[Step 4]
(Supply of $NH_3$ Gas)

After Step 3 is terminated, $NH_3$ gas activated with heat is supplied onto the wafer 200 in the process chamber 201.

This step has the same procedure as the above-described surface modifying step. A time period for which the $NH_3$ gas is supplied to the wafer 200, i.e., a gas supply time period (or an irradiation time period), may fall within a range of, for example, 1 to 120 seconds, and in some embodiments, 1 to 60 seconds. Other processing conditions are the same as those of the surface modifying step. The $NH_3$ gas is thermally activated under the foregoing conditions. Supplying the thermally activated $NH_3$ gas can cause soft reaction, thereby providing soft nitridation which will be described later.

In this operation, the gas flowing into the process chamber 201 is the thermally activated $NH_3$ gas, and none of the HCDS gas, the $C_3H_6$ gas, and the $O_2$ gas flows into the process chamber 201. Accordingly, the activated $NH_3$ gas is supplied onto the wafer 200 without causing gaseous reaction. The $NH_3$ gas supplied onto the wafer 200 reacts with at least a portion of the third layer (i.e., SiOC layer) formed on the wafer 200 in Step 3. Accordingly, the third layer can be thermally nitrided under a non-plasma state and be changed (or modified) into a fourth layer containing Si, O, C, and N, i.e., a silicon oxycarbonitride layer (SiOCN layer). In addition, when the fourth layer is formed, impurities such as Cl and the like contained in the third layer form gaseous material containing at least Cl during the modification reaction by the $NH_3$ gas and are discharged out of the process chamber 201. As such, impurities such as Cl and the like in the third layer are separated from the third layer as the impurities are withdrawn or desorbed out of the third layer. Accordingly, the fourth layer has fewer impurities such as Cl and the like than the third layer.

In addition, by supplying the activated $NH_3$ gas onto the wafer 200, the outermost surface of the third layer is modified during the nitirdation of the third layer. HCDS can be easily adsorbed on the outermost surface of the third layer subjected to the surface modification during the nitridation, i.e., on the outermost surface of the fourth layer, and Si can be easily deposited on the outermost surface of the fourth layer in subsequent Step 1. Thus, the $NH_3$ gas used in Step 4 also acts as an adsorption and deposition promoting gas for promoting adsorption and deposition of HCDS and Si on the outermost surface of the fourth layer (i.e., the outermost surface of the wafer 200).

In this operation, the nitridation reaction of the third layer should be unsaturated. For example, when the third layer having a thickness of several atomic layers is formed in Steps 1 to 3, at least a portion of the surface layer (e.g., one atomic layer of the surface) of the third layer is nitrided. In this case, the nitridation is performed under a condition where the nitridation reaction of the third layer is unsaturated so as to prevent the entire third layer from being nitrided. Although several layers below the surface layer of the third layer may be nitrided depending on conditions, it is desirable to nitride only the surface layer since controlling a composition ratio of the SiOCN film to be finally formed can be improved.

(Residual Gas Removal)

After the fourth layer is formed, the valve 243b is closed to stop the supply of the $NH_3$ gas. Then, according to the same procedure as the surface modifying step, residual gas remaining in the process chamber 201, such as the $NH_3$ gas which has not reacted or remains after contributing to the formation of the fourth layer, and reaction byproducts are removed out of the process chamber 201. In this operation, like the surface modifying step, the residual gas remaining in the process chamber 201 may not be removed completely.

Examples of the nitriding gas may include hydrogen nitride-based gases such as $N_2H_2$ gas, $N_2H_4$ gas, $N_3H_8$ gas, and the like, and gases containing compounds thereof, in addition to the $NH_3$ gas. Examples of the inert gas may include rare gases such as Ar gas, He gas, Ne gas, Xe gas, and the like, in addition to the $N_2$ gas.

(Performing Predetermined Number of Times)

When the cycle in which Steps 1 to 4 as mentioned above are not performed simultaneously is performed once or more (e.g., a predetermined number of times), the SiOCN film having a predetermined composition and a predetermined film thickness can be formed on the wafer 200. In some embodiments, the above-mentioned cycle is repeated multiple times. As such, in some embodiments, a thickness of the SiOCN layer formed per cycle is set to be smaller than a desired film thickness and the foregoing cycle is repeated multiple times until a desired film thickness is obtained.

(Purging and Returning to Atmospheric Pressure)

The valves 243e and 243f are opened to supply $N_2$ gas from the gas supply pipes 232e and 232f, respectively, into the process chamber 201 and the $N_2$ gas is exhausted through the exhaust pipe 231. The $N_2$ gas acts as a purge gas. Thus, the interior of the process chamber 201 is purged with the purge gas and the residual gas remaining in the process chamber 201 and reaction byproducts are removed from the process chamber 201 (i.e., purging). Thereafter, an atmosphere in the process chamber 201 is substituted with the inert gas (i.e., inert gas substitution), and the internal pressure of the process chamber 201 returns to normal pressure (i.e., returning to atmospheric pressure).

(Boat Unloading and Wafer Discharging)

The seal cap 219 is lowered by the boat elevator 115 to open the lower end of the manifold 209. The processed wafers 200, supported by the boat 217, are unloaded out of the reaction tube 203 through the lower end of the manifold 209 (i.e., boat unloading). Then, the processed wafers 200 are discharged from the boat 217 (i.e., wafer discharging).

(3) Cleaning Process

When the above-described film forming process is performed, deposits such as a thin film including a SiOCN film are accumulated on the inner wall of the reaction tube 203, the surfaces of the nozzles 249a and 249b, the surface of the boat 217, and so on. Specifically, the deposits such as a thin film are adhered to and accumulated on surfaces of members in the process chamber 201 heated to the film forming temperature. In addition, the deposits are adhered to and accumulated on the interiors of the nozzles 249a and 249b heated to the film forming temperature. A cleaning process is performed before an amount (or thickness) of such deposits reaches a predetermined amount (or thickness) which is smaller than an amount (or thickness) at which the deposits start to peel-off or drop.

The cleaning process includes supplying a fluorine-based gas as a cleaning gas from the nozzle 249a heated to a first cleaning temperature and a reaction promoting gas as a cleaning gas from the nozzle 249b heated to the first cleaning temperature into the process chamber 201 heated to the first cleaning temperature in order to remove deposits including a SiOCN film deposited on surfaces of members in the process chamber 201 by thermochemical reaction (i.e., first cleaning step); changing an internal temperature of the process chamber 201 to a second cleaning temperature that is higher than the first cleaning temperature (i.e., temperature rising step); supplying a fluorine-based gas from the nozzle 249a heated to the second cleaning temperature into the process chamber 201 heated to the second cleaning temperature in order to remove a substance remaining on the surfaces of the members in the process chamber 201 by thermochemical reaction after removing the deposits and to remove deposits deposited in the nozzle 249a by thermochemical reaction (i.e., second cleaning step); and supplying a fluorine-based gas from the nozzle 249b heated to the second cleaning temperature into the process chamber 201 heated to the second cleaning temperature in order to remove the substance remaining on the surfaces of the members in the process chamber 201 by thermochemical reaction after removing the deposits and to remove deposits deposited in the nozzle 249b by thermochemical reaction (third cleaning step).

In each of the first to third cleaning steps, supplying the cleaning gas into the process chamber 201 and exhausting the cleaning gas from the process chamber 201 via the exhaust pipe 231 in order to clean the process chamber 201 (i.e., Steps A1 to A3 as a first procedure) and maintaining a state where distribution of the cleaning gas into the exhaust pipe 231 is substantially stopped in order to cool the exhaust pipe 231 (Steps B1 to B3 as a second procedure) are alternately repeated.

Step A1 in the first cleaning step repeats a cycle that includes supplying the cleaning gas into the process chamber 201 (Sub-Step a1) and exhausting the cleaning gas from the process chamber 201 via the exhaust pipe 231 while the supply of the cleaning gas into the process chamber 201 is stopped (Sub-Step a2). As such, the supply of the cleaning gas into the process chamber 201 is intermittently performed multiple times.

In Steps A2 and A3 of the second and third cleaning steps, the supply of the cleaning gas into the process chamber 201 is continuously performed.

Figure 5:
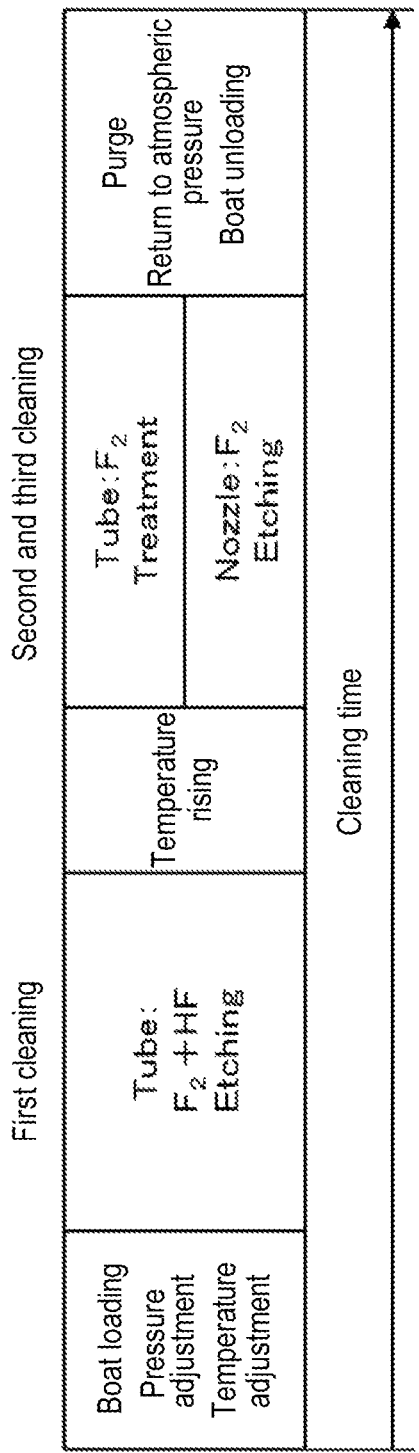
FIG. 5 is a flow diagram of a cleaning sequence according to an embodiment of the present disclosure.
Figure 6:
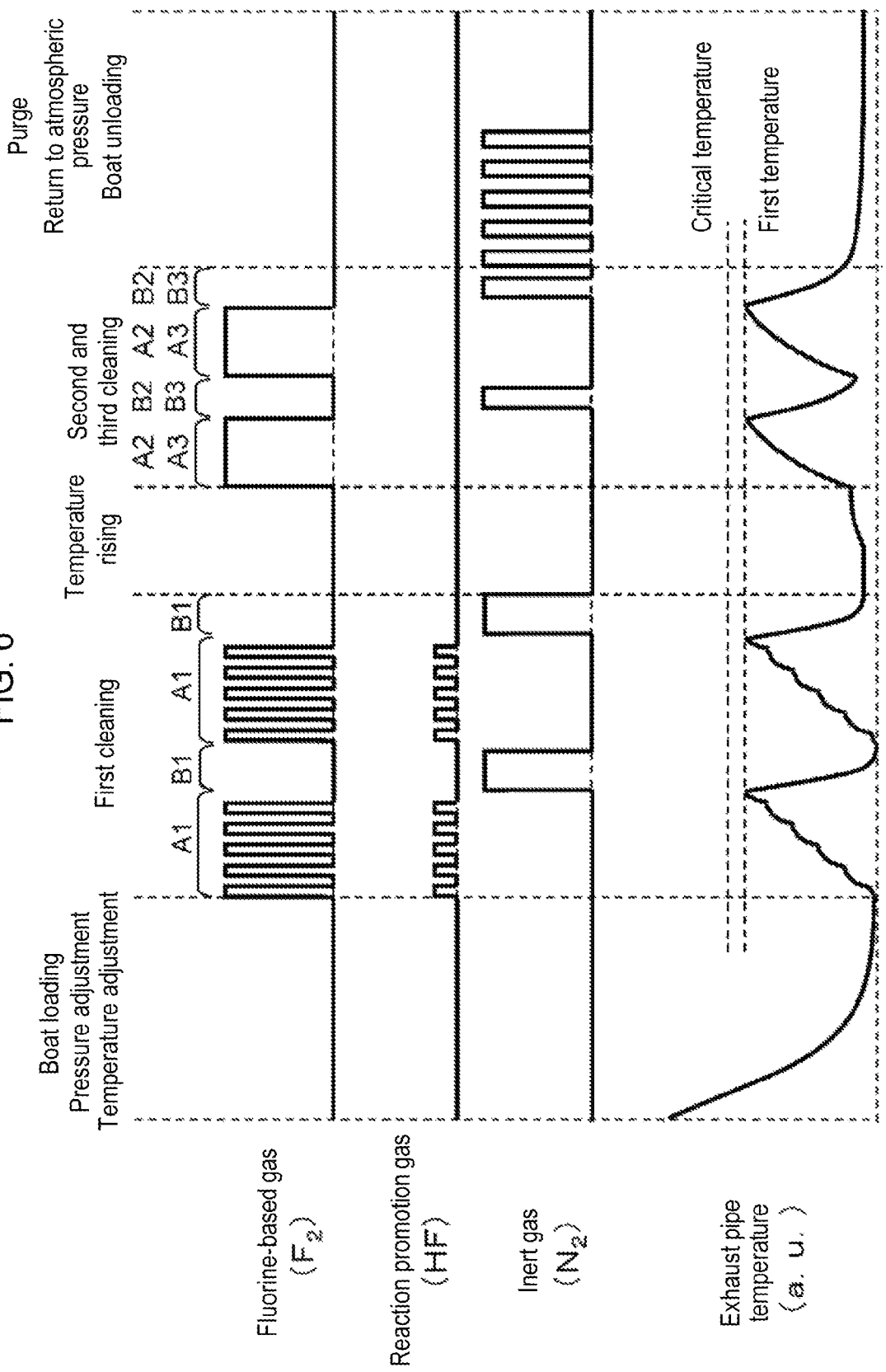
FIG. 6 is a view illustrating gas supply timings and temperature of an exhaust pipe in the cleaning sequence according to the embodiment of the present disclosure.

Hereinafter, an example of the cleaning process using $F_2$ gas as the fluorine-based gas, HF gas as the reaction promotion gas, and $N_2$ gas as an inert gas will be described with reference to FIGS. 5 and 6. In the following description, operations of various parts constituting the substrate processing apparatus are controlled by the controller 121. In FIG. 5, "Etching" represents a deposit removing process which will be described later and "Treatment" represents a treatment process which will be described later. "A1," "A2," and "A3" in FIG. 6 represent Steps A1 to A3 of cleaning the interior of the process chamber 201, respectively. "B1," "B2" and "B3" in FIG. 6 represent Steps B1 to B3 of cooling the exhaust pipe 231.

(Boat Loading)

The empty boat 217 with no wafer 200 loaded therein is lifted up by the boat elevator 115 to be transferred into the process chamber 201. In this state, the seal cap 219 seals the lower end portion of the manifold 209 via the O-ring 220b.

(Pressure Adjustment and Temperature Adjustment)

The interior of the process chamber 201 is vacuum-exhausted by the vacuum pump 246 to a first cleaning pressure. Further, the interior of the process chamber 201 is heated by the heater 207 to the first cleaning temperature. When the interior of the process chamber 201 is heated to the first cleaning temperature, the inner wall of the reaction tube 203, the surfaces and interiors (or inner walls) of the nozzles 249a and 249b, the surface of the boat 217, and so on are heated to the first cleaning temperature. Once the internal temperature of the process chamber 201 reaches the first cleaning temperature, the first cleaning temperature is controlled to be maintained until the first cleaning step which will be described below is terminated. Next, the boat 217 begins to be rotated by the rotary mechanism 267. The boat 217 is continuously rotated by the rotary mechanism 267 until the third cleaning step which will be described later is terminated. However, the boat 217 may not be rotated.

(First Cleaning Step)

Subsequently, the following two steps, i.e., Steps A1 and B1, are sequentially performed.

[Step A1]

This step includes the following two sub-steps, i.e., Sub-Steps a1 and a2, which are sequentially performed.

In Sub-Step a1, while the internal temperature and pressure of the process chamber 201 are maintained at the first cleaning temperature and the first cleaning pressure, respectively, the $F_2$ gas is supplied from the nozzle 249a heated to the first cleaning temperature into the process chamber 201 and the HF gas is supplied from the nozzle 249b heated to the first cleaning temperature into the process chamber 201.

Here, in Sub-Step a1, the valves 243c and 243d are opened to flow the $F_2$ gas from the gas supply pipe 232c and the HF gas from the gas supply pipe 232d. Additionally, in this operation, $N_2$ gas may flow from the gas supply pipes 232e and 232f to dilute the $F_2$ gas and the HF gas in the gas supply pipes 232a and 232b, respectively. By controlling a supply flow rate of the $N_2$ gas, concentrations of the $F_2$ gas and the HF gas supplied into the process chamber 201 can be controlled.

As such, a mixture of the $F_2$ gas and the HF gas is supplied, as a cleaning gas, into the process chamber 201.

When the mixed gas passes through the interior of the process chamber 201 and is exhausted from the exhaust pipe 231, this gas comes into contact with members in the process chamber 201, for example, the inner wall of the reaction tube 203, the surfaces of the nozzles 249a and 249b, the surface of the boat 217, and so on. In this operation, deposits adhered to the members in the process chamber 201 are removed by thermochemical reaction. Specifically, the deposits are removed by etching reaction between the mixed gas and the deposits. In addition, since the HF gas acts to promote the etching reaction by the $F_2$ gas, the HF gas can increase an etching rate and enhance the cleaning action. Thus, the process conditions such as the internal temperature and so on of the process chamber 201 can be set to a lower temperature condition.

In addition, in Sub-Step a1, the $F_2$ gas and the HF gas are supplied using the respective separate nozzles 249a and 249b. Since no HF gas is supplied into the nozzle 249a and only the $F_2$ gas or only the $F_2$ gas diluted with the $N_2$ gas exists in the nozzle 249a, the above-described thermochemical reaction is unlikely to occur in the nozzle 249a. However, the $F_2$ gas alone may cause an etching reaction. In this case, under the first cleaning temperate re, the etching reaction using the $F_2$ gas alone can be minimized and may be negligible as compared to the earlier-described etching reaction. In addition, since no $F_2$ gas is supplied into the nozzle 249b and only the HF gas or only the HF gas diluted with the $N_2$ gas exists in the nozzle 249b, the thermochemical reaction is unlikely to occur in the nozzle 249b under the above-described conditions.

When a preset gas supply time elapses, the valves 243c and 243d are closed to terminate Sub-Step a1 and start Sub-Step a2. In Sub-Step a2, under a state where the supply of the mixture of the $F_2$ gas and the HF gas (i.e., the cleaning gas) into the process chamber 201 is stopped, the cleaning gas and so on in the process chamber 201 is exhausted through the exhaust pipe 231 with the APC valve 244 opened. In this operation, the gas supply pipes 232e and 232f may be opened to supply the $N_2$ gas into the process chamber 201. A time period for performing Sub-Step a2 is set to a time period required to vary the internal pressure of the process chamber 201. For example, the time period for performing Sub-Step a2 is set to a time period required to complete discharge of the cleaning gas from the process chamber 201 or a shorter time period than the above described time period. If the time period for performing Sub-Step a2 is set in this manner, the cleaning gas can be always distributed in the exhaust pipe 231 while Sub-Step a2 is performed.

According to some embodiments, in Sub-Step a2, the degree of opening of the APC valve 244 may be set to be greater than the degree of the APC valve 244 in Sub-Step a1, for example, to a degree of full opening. In this case, a large amount of the cleaning gas can be distributed at once from the process chamber 201 into the exhaust pipe 231 immediately after Sub-Step a2 starts, so that the internal pressure of the process chamber 201 can be rapidly decreased.

Thereafter, Sub-Steps a1 and a2 are alternately repeated. In Sub-Step a1, the internal pressure of the process chamber 201 may be set to be relatively high so that the cleaning gas is sealed in the process chamber 201. This makes it easy to spread the cleaning gas over the entire region in the process chamber 201 and makes it possible to increase efficiency of the thermochemical reaction by the cleaning gas. As a result, it is possible to provide efficient cleaning over the entire region in the process chamber 201. In addition, by alternately repeating Sub-Steps a1 and a2, the supply of the cleaning gas into the process chamber 201 can be intermittently performed so as to vary the internal pressure of the process chamber 201 repeatedly. By varying the internal pressure of the process chamber 201 in this manner, shock that is caused by the pressure variation can be applied to deposits in the process chamber 201. As a result, since the deposits can be etched while the deposits are cracked or peeled off, it is possible to increase efficiency of removing the deposits from the process chamber 201.

[Step B1]

However, if the above-described film forming process of forming the SiOCN film is performed, Cl contained in the HCDS gas that is distributed in the process chamber 201 and the exhaust pipe 231 reacts with N or H contained in the $NH_3$ gas or the like that is distributed in the process chamber 201 and the exhaust pipe 231. As a result, reaction byproducts including ammonium chloride ($NH_4Cl$) and the like may adhere to a low temperature part such as an inner wall of the exhaust pipe 231. In particular, if a gas containing a larger number of Cl atoms included in one molecule, such as HCDS gas, is used as the precursor gas, the reaction byproducts such as $NH_4Cl$ are more likely to be produced and an amount of adhesion of the reaction byproducts is more likely to be increased than when a gas containing a smaller number of Cl atoms included in one molecule, such as MCS gas or DCS gas, is used as the precursor gas. In addition, even when the exhaust pipe 231 is configured as a pipe having an uneven structure in its inner wall, such as a bellows-shaped pipe, the amount of adhesion of the reaction byproducts is likely to be increased.

When Step A1 as described above is performed, the cleaning gas (i.e., the mixture of the $F_2$ gas and the HF gas) supplied into the process chamber 201 is intensively introduced into the exhaust pipe 231 so that the cleaning gas of a high concentration is distributed in the exhaust pipe 231. When Step A1 is performed in a state where the reaction byproducts adhere to the interior of the exhaust pipe 231, the cleaning gas distributed in the exhaust pipe 231 reacts with the reaction byproducts adhered to the interior of the exhaust pipe 231. Then, as shown in FIG. 6, the temperature of the exhaust pipe 231 is increased by reaction heat generated by the above reaction. In particular, if the degree of opening of the APC valve 244 in Sub-Step a2 is set to be higher than that of the APC valve 244 in Sub-Step a1, a large amount of the cleaning gas is introduced at once from the process chamber 201 into the exhaust pipe 231 immediately after Sub-Step a2 starts, and thus, the temperature of the exhaust pipe 231 is likely to be increased. If the temperature of the exhaust pipe 231 increases up to a temperature exceeding 200 degrees C., the exhaust pipe 231 may be corroded and damaged even when the exhaust pipe 231 is made of an alloy having high heat resistance and corrosion resistance, such as Hastelloy®.

Accordingly, in this embodiment, if the temperature of the exhaust pipe 231, which is measured by the temperature sensor 231a, increases to a predetermined threshold (e.g., a first temperature), the operation of Step A1 is stopped. Accordingly, the distribution of the cleaning gas into the exhaust pipe 231 is substantially stopped. Even after the operation of Step A1 is stopped, the cleaning gas remaining in the process chamber 201 may, in some cases, transiently flow into the exhaust pipe 231. However, an amount of the cleaning gas transiently flowing into the exhaust pipe 231 may be too small to react with the reaction byproducts adhered to the interior of the exhaust pipe 231 or may be an amount that does not cause reaction heat sufficient to increase the temperature of the exhaust pipe 231 even when it reacts. In the present disclosure, this case is considered to be included in the state where "the distribution of the cleaning gas into the exhaust pipe 231 is substantially stopped."

The first temperature is set to be lower than a temperature at which corrosion occurs in the exhaust pipe 231 (hereinafter, referred to as a critical temperature). Although the first temperature may be appropriately determined depending on various conditions such as material, structure, heat capacity, radiation efficiency of the exhaust pipe 231, a kind and a flow rate of the cleaning gas, a processing temperature, and so on, if the above-mentioned critical temperature is 200 degrees C., the first temperature may be set to fall within a range of, for example, 120 degrees C. to 180 degrees C.

Thereafter, by maintaining for a predetermined time period the state where the distribution of the cleaning gas into the exhaust pipe 231 is substantially stopped, the exhaust pipe 231 is cooled (i.e., natural cooling). The exhaust pipe 231 continues to be cooled at least until the temperature of the exhaust pipe 231, which is measured by the temperature sensor 231a, reaches a predetermined threshold (e.g., a second temperature) that is lower than the first temperature.

The second temperature may be set to ½ or less of the first temperature. Although the second temperature may be appropriately determined depending on various conditions such as material, structure, heat capacity, radiation efficiency of the exhaust pipe 231, a kind and a flow rate of the cleaning gas, a processing temperature, and so on, if the above-mentioned critical temperature is 200 degrees C., the second temperature may be set to fall within a range of, for example, 60 degrees C. to 90 degrees C. In addition, a time period taken to maintain the state where the distribution of the cleaning gas into the exhaust pipe 231 is substantially stopped, i.e., a time period for performing Step B1, may be set to be longer than a time period required to perform the cycle including Sub-Steps a1 and a2 once or longer than a time period for performing Step A1.

In addition, in Step B1, the valves 243e and 243f may be opened to flow the $N_2$ gas into the exhaust pipe 231 as shown in FIG. 6. In this case, the $N_2$ gas may act as a cooling gas (or a cooling medium) to promote the cooling of the exhaust pipe 231. In this operation, the $N_2$ gas may be directly supplied into the exhaust pipe 231. In this case, for example, a port for supplying the $N_2$ gas may be installed at an upstream side of the exhaust pipe 231, a supply pipe for supplying the $N_2$ gas may be connected to this port, and the $N_2$ gas may be supplied into the exhaust pipe 231 via the supply pipe and the port. By directly supplying the $N_2$ gas into the exhaust pipe 231 without passing through the hot process chamber 201, it is possible to further promote the cooling of the exhaust pipe 231. This makes it possible to shorten the time period for performing Step B1. In addition, in Step B1, the valves 243e and 243f may be closed so that no $N_2$ gas flows into the exhaust pipe 231.

[Performing Predetermined Number of Times]

Thereafter, Step A1 and Step B1 are alternately repeated a predetermined number of times to progress the first cleaning step. When Step A1 and Step B1 are alternately repeated, the above-described process of removing deposits can be appropriately progressed with the temperature of the exhaust pipe 231 set to be lower than the critical temperature.

(Temperature Rising Step)

When the first cleaning step is terminated, the interior of the process chamber 201 is vacuum-exhausted by the vacuum pump 246 to a second cleaning pressure. Further, the interior of the process chamber 201 is heated by the heater 207 to a second cleaning temperature. When the interior of the process chamber 201 is heated to the second cleaning temperature, the inner wall of the reaction tube 203, the surfaces and interiors (or inner walls) of the nozzles 249a and 249b, the surface of the boat 217, and so on are heated to the second cleaning temperature. If the internal pressure and temperature of the process chamber 201 reach the second cleaning pressure and the second cleaning temperature, respectively, the second cleaning pressure and the second cleaning temperature are controlled such that the second cleaning pressure and cleaning temperature are maintained until the second and third cleaning processes which will be described later are terminated.

The second cleaning temperature is set to be higher than the first cleaning temperature. Thus, when the first cleaning process transitions to the second cleaning process, the internal temperature of the process chamber 201 is changed to a temperature higher than the first cleaning temperature.

In this step, the valves 243c to 243f may be closed to stop supply of the $F_2$ gas, the HF gas, and the $N_2$ gas into the process chamber 201, or at least one of the valves 243c to 243f may be opened to continue the supply of at least one of the $F_2$ gas, the HF gas, and the $N_2$ gas into the process chamber 201. The valves 243a and 243b remain closed, as in the first and second cleaning steps.

(Second Cleaning Step)

When the temperature rising step is terminated, the following two steps, i.e., Step A2 and Step B2, are sequentially performed.

[Step A2]

In this step, in a state where the internal temperature and pressure of the process chamber 201 are maintained at the second cleaning temperature and the second cleaning pressure, respectively, $F_2$ gas is continuously supplied from the nozzle 249a heated to the second cleaning temperature into the process chamber 201. In this operation, the valve 243c is opened to flow the $F_2$ gas from the gas supply pipe 232c. In addition, in this operation, the valve 243e may be opened to flow $N_2$ gas from the gas supply pipe 232e in order to dilute the $F_2$ gas in the gas supply pipe 232a.

In this operation, the valve 243f is opened to supply $N_2$ gas from the nozzle 249b instead of supplying HF gas. As such, in this step, as shown in FIGS. 5 and 6, only the $F_2$ gas or only the $F_2$ gas diluted with the $N_2$ gas is supplied into the process chamber 201 as a cleaning gas. In this operation, no $N_2$ gas may be supplied from the nozzle 249b. However, when the $N_2$ gas is supplied from the nozzle 249b, the $F_2$ gas can be prevented from seeping into the nozzle 249b.

The supply of the $F_2$ gas or the $F_2$ gas diluted with the $N_2$ gas into the process chamber 201 heated to the second cleaning temperature removes, by thermochemical reaction, a substance that remains on the surfaces of the members in the process chamber 201 after the deposits are removed in the first cleaning step, whereby a treatment process is provided to the surfaces of the members in the process chamber 201.

For example, quartz cracks occurring on surfaces of quartz members such as the inner wall of the reaction tube 203, the surfaces of the nozzles 249a and 249b, the surface of the boat 217, and so on are removed. Specifically, the quartz cracks occurring on the quartz members are etched and removed (or eliminated) by the $F_2$ gas supplied into the process chamber 201. In addition, for example, minute quartz powders, which are generated due to quartz cracks, etc., and adhered to the surfaces of the members in the process chamber 201, are etched and removed by the $F_2$ gas supplied into the process chamber 201. In addition, for example, deposits such as a residual film of SiOCN or the like is etched and removed by the $F_2$ gas supplied into the process chamber 201.

In this process, the surfaces of the quartz members in the process chamber 201 after the deposit removal are slightly etched to be smoothed. For example, the inner wall of the reaction tube 203, the surfaces of the nozzles 249a and 249b, the surface of the boat 217, and the like after the deposit removal, are slightly etched to be smoothed. The surfaces of the quartz members may be etched as slight as at least quartz cracks are removed, and is required not to reach excessive etching (i.e., over-etching). With process conditions to be described later, it is possible to avoid the over-etching to the surfaces of the quartz members and to perform proper etching to the surfaces of the quartz members.

In addition, by supplying the $F_2$ gas or the $F_2$ gas diluted with the $N_2$ gas into the nozzle 249a heated to the second cleaning temperature, the deposits adhered to the interior of the nozzle 249a through the film forming process are removed by thermochemical reaction. Specifically, the deposits adhered to the inner wall of the nozzle 249a by the film forming process are etched by the $F_2$ gas supplied into the nozzle 249a heated to the second cleaning temperature and are removed from the interior of the nozzle 249a. In addition, if the $F_2$ gas is used alone under the second cleaning temperature, sufficient etching reaction occurs.

In addition, in this operation, since no $F_2$ gas is supplied or seeps into the nozzle 249b, the above-described thermochemical reaction, i.e., the deposit etching reaction, does not occur in the nozzle 249b.

[Step B2]

When the above-described Step A2 is performed, the cleaning gas (i.e., $F_2$ gas) is distributed in the exhaust pipe 231. When Step A2 is performed in a state where reaction byproducts are adhered to the interior of the exhaust pipe 231, like Step A1, the cleaning gas distributed in the exhaust pipe 231 reacts with the reaction byproducts adhered to the interior of the exhaust pipe 231, so that the temperature of the exhaust pipe 231 is increased.

Accordingly, if the temperature of the exhaust pipe 231, which is measured by the temperature sensor 231a, increases to a predetermined temperature (e.g., the first temperature), the valve 243c is closed to stop the operation of Step A2. Then, according to the same procedure as Step B1, the exhaust pipe 231 is cooled. Like Step B1, the cooling of the exhaust pipe 231 is performed at least until the temperature of the exhaust pipe 231 reaches the second temperature that is lower than the first temperature.

[Performing Predetermined Number of Times]

Thereafter, Step A2 and Step B2 are alternately repeated a predetermined number of times to progress to the second cleaning step. When Step A2 and Step B2 are alternately repeated, the above-described treatment process and deposit removal process can be appropriately progressed with the temperature of the exhaust pipe 231 set to be lower than the critical temperature.

(Third Cleaning Step)

When the second cleaning step is terminated, the following two steps, i.e., Step A3 and Step B3, are sequentially performed.

[Step A3]

In this step, in a state where the internal temperature and pressure of the process chamber 201 are maintained at the second cleaning temperature and the second cleaning pressure, respectively, the $F_2$ gas is continuously supplied from the nozzle 249b heated to the second cleaning temperature into the process chamber 201. The valve 243d is opened to flow the $F_2$ gas from the gas supply pipe 232d. In addition, in this operation, the valve 243f may be opened to flow the $N_2$ gas from the gas supply pipe 232f in order to dilute the $F_2$ gas in the gas supply pipe 232b.

In this operation, the valve 243e is opened to supply the $N_2$ gas from the nozzle 249a instead of supplying the HF gas. Specifically, in this step, like the second cleaning step, only the $F_2$ gas or only the $F_2$ gas diluted with the $N_2$ gas is supplied into the process chamber 201 as a cleaning gas. In this operation, no $N_2$ gas may be supplied from the nozzle 249a. However, when the $N_2$ gas is supplied from the nozzle 249a, the $F_2$ gas can be prevented from seeping into the nozzle 249a.

When the $F_2$ gas or the $F_2$ gas diluted with the $N_2$ gas is supplied into the process chamber 201 heated to the second cleaning temperature, the above-described treatment process continues to be performed on the surfaces of the members in the process chamber 201.

In addition, the supply of the $F_2$ gas or the $F_2$ gas diluted with the $N_2$ gas into the process chamber 201 heated to the second cleaning temperature removes, by thermochemical reaction, the deposits adhered to the interior of the nozzle 249b when the film forming process is performed. Specifically, the deposits adhered to the inner wall of the nozzle 249b when the film forming process is performed are etched by the $F_2$ gas supplied into the nozzle 249b heated to the second cleaning temperature and are removed from the nozzle 249b.

In addition, in this operation, since no $F_2$ gas is supplied or seeps into the nozzle 249a, the above-described thermochemical reaction, i.e., the etching reaction of the inner wall of the nozzle 249a, does not occur in the nozzle 249a.

[Step B3]

When the above-described Step A3 is performed, the cleaning gas (i.e., $F_2$ gas) is distributed in the exhaust pipe 231. When Step A3 is performed in a state where reaction byproducts adhere to the interior of the exhaust pipe 231, like Steps A1 and A2, the cleaning gas distributed in the exhaust pipe 231 reacts with the reaction byproducts adhered to the interior of the exhaust pipe 231, so that the temperature of the exhaust pipe 231 is increased.

Accordingly, if the temperature of the exhaust pipe 231, which is measured by the temperature sensor 231a, increases to a predetermined temperature (e.g., the first temperature), the valve 243d is closed to stop the operation of Step A3. Then, according to the same procedure as Step B1, the exhaust pipe 231 is cooled. Like Step B1, the cooling of the exhaust pipe 231 is performed at least until the temperature of the exhaust pipe 231 reaches the second temperature that is lower than the first temperature.

[Performing Predetermined Number of Times]

Thereafter, Step A3 and Step B3 are alternately repeated a predetermined number of times to progress to the third cleaning step. When Step A3 and Step B3 are alternately repeated, the above-described treatment process and deposit removal process can be appropriately progressed with the temperature of the exhaust pipe 231 set to be lower than the critical temperature.

(Purging and Returning to Atmospheric Pressure)

When the third cleaning step is terminated, the valve 243d is closed to stop the supply of the $F_2$ gas into the process chamber 201. Then, the valve 243e and 243f are opened to flow the $N_2$ gas through the gas supply pipes 232e and 232f, respectively, into the process chamber 201 and the $N_2$ gas is exhausted through the exhaust pipe 231. The $N_2$ gas acts as a purge gas. Thus, the interior of the process chamber 201 is purged. In this operation, as shown in FIG. 6, by repeating the opening and closing operation of the valves 243e and 243f, purging of the interior of the process chamber 201 may be intermittently performed (i.e., cycle purging). Thereafter, the atmosphere in the process chamber 201 is substituted with the $N_2$ gas (i.e., inert gas substitution) and the internal pressure of the process chamber 201 returns to normal pressure (i.e., returning to atmospheric pressure).

(Boat Unloading)

The seal cap 219 is lowered by the boat elevator 115 to open the lower end of the manifold 209. Then, the empty boat 217 is transferred through the lower end of the manifold 209 out of the reaction tube 203 (i.e., boat unloading). When these series of steps are terminated, the earlier-described film forming process is resumed.

(4) Modifications of Cleaning Process

The cleaning process in this embodiment is not limited to the above-described forms but may be altered as the following modifications.

(Modification 1)

In Step A1, the supply of the $F_2$ gas and the HF gas into the process chamber 201 may be performed continuously, like Steps A2 and A3, instead of intermittently. To this end, In Step A1, the valves 243c and 243d may remain opened. Even in this case, although the temperature of the exhaust pipe 231 is increased due to the reaction heat of the cleaning gas and the reaction byproducts, by performing Step B1 at the above-described timing, it is possible to appropriately progress the above-described deposit removal process, with the temperature of the exhaust pipe 231 set to the temperature lower than the critical temperature, like the cleaning sequence shown in FIG. 6.

(Modification 2)

In Step A1, by continuously supplying the $F_2$ gas and the HF gas into the process chamber 201 and intermittently supplying the $N_2$ gas into the process chamber 201, the internal pressure of the process chamber 201 may be varied. To this end, in Step A1, with the valves 243c and 243d opened, opening and closing operations of at least one of the valves 243e and 243f may be repeated. Even in this case, it is possible to increase efficiency of removal of deposits from the process chamber 201, like the cleaning sequence shown in FIG. 6.

(Modification 3)

In Step A1, a step of supplying and confining the $F_2$ gas and the HF gas into the process chamber 201 and a step of exhausting the interior of the process chamber 201 may be repeated. For example, in Step A1, with the valves 243c and 243d opened, opening and closing operations of the APC valve 244 may be repeated. Further, for example, in Step A1, an operation of keeping the valves 243c and 243d opened in a state where the APC valve 244 is closed and an operation of keeping the APC valve 244 opened in a state where the valves 243c and 243d are closed may be repeated.

In addition, in Step A1, a step of supplying and confining the $F_2$ gas and the HF gas into the process chamber 201, a step of maintaining a state where the $F_2$ gas and the HF gas are confined in the process chamber 201, and a step of exhausting the interior of the process chamber 201 may be repeated. For example, in Step A1, an operation of keeping the valves 243c and 243d opened in a state where the APC valve 244 is closed, an operation of keeping the APC valve 244 and the valves 243c and 243d closed, and an operation of keeping the APC valve 244 opened in a state where the valves 243c and 243d are closed may be repeated Even in this case, since the internal pressure of the process chamber 201 can be varied, it is possible to increase efficiency of removal of deposits from the process chamber 201, like the cleaning sequence shown in FIG. 6.

In addition, by supplying and confining the $F_2$ gas and the HF gas into the process chamber 201, it is possible to prevent the $F_2$ gas and the HF gas from being discharged from the process chamber 201 without contributing to the cleaning In addition, this confinement makes it easy to spread the $F_2$ gas and the HF gas over the entire region in the process chamber 201, which facilitates the cleaning over the entire region in the process chamber 201. Thus, it is possible to secure a time for which the $F_2$ gas and the HF gas stay in the process chamber 201, i.e., a reaction time required for the cleaning Accordingly, it is possible to improve the above-described cleaning operation over the entire region in the process chamber 201. In addition, it is possible to reduce the amount of cleaning gas discharged from the process chamber 201 without contributing to the cleaning, which can result in increased use efficiency of the cleaning gas and reduced costs of the cleaning process. In addition, by keeping the cleaning gas confined in the process chamber 201, it is possible to further improve the cleaning operation over the entire region in the process chamber 201.

In addition, when the opening and closing operation of the APC valve 244 is performed in the first cleaning step, a full close operation of the APC valve 244 and a full open operation of the APC valve 244 may be controlled to be alternately repeated. Additionally, when the APC valve 244 is closed in the first cleaning step, without fully closing the APC valve 244, the degree of opening of the APC valve 244 may be controlled such that the internal pressure of the process chamber 201 reaches a predetermined pressure (which is a constant pressure). In addition, when the APC valve 244 is opened in the first cleaning step, without fully opening the APC valve 244, the degree of opening of the APC valve 244 may be controlled such that the internal pressure of the process chamber 201 reaches a predetermined pressure (which is a constant pressure). Further, the above controls may be performed in proper combination.

(Modification 4)

For example, if no deposits adhere to the interior of the nozzle 249b or if only a small amount of deposits adhere to the interior of the nozzle 249b, the third cleaning step may not be performed after performing the second cleaning step. In addition, if only a small amount of deposits adhere to the interior of the nozzle 249b, the third cleaning step may be performed for a shorter time than the second cleaning step. For example, a time period for performing Step A3 may be shorter than a time period for performing Step A2 or a time period for performing the entire third cleaning step may be shorter than a time period for performing the entire second cleaning step. In addition, the number of times Steps A3 and B3 are repeated may be smaller than the number of times Steps A2 and B2 are repeated. This can shorten a total time period required for the cleaning process, thereby increasing productivity. In addition, this can prevent etching damage to the interior (i.e., the inner wall) of the nozzle 249b. In addition, this can prevent an increase in the temperature of the exhaust pipe 231 to avoid corrosion of the exhaust pipe 231 more reliably.

(5) Process Conditions in Cleaning Process

Hereinafter, process conditions of the first to third cleaning steps are described.

(Process Conditions in First Cleaning Step)

An example of the process conditions in Sub-Step a1 of Step A1 may be as follows:

First cleaning temperature: less than 400 degrees C. and, in some embodiments, 200 to 350 degrees C.

First cleaning pressure: 1,330 Pa (10 Torr) to 101,300 Pa (atmospheric pressure) and, in some embodiments, 13,300 Pa (100 Torr) to 53,320 Pa (400 Torr)

$F_2$ gas flow rate: 0.5 to 20 slm

HF gas flow rate: 0.5 to 20 slm $N_2$ gas flow rate: 1 to 20 slm

HF gas/$F_2$ gas flow rate ratio: 0.25 to 4

Performance time duration: one minute to three minutes.

An example of the process conditions in Sub-Step a2 of Step A1 may be as follows:

First cleaning temperature: less than 400 degrees C. and, in some embodiments, 200 to 350 degrees C.

First cleaning pressure: 10 Pa to 50 Pa $F_2$ gas flow rate: 0 slm

HF gas flow rate: 0 slm $N_2$ gas flow rate: 1 to 20 slm

Performance time period: one minute to three minutes.

An example of the process conditions in Step B1 may be as follows:

First cleaning temperature: less than 400 degrees C. and, in some embodiments, 200 to 350 degrees C.

First cleaning pressure: 10 Pa to 50 Pa $F_2$ gas flow rate: 0 slm

HF gas flow rate: 0 slm $N_2$ gas flow rate: 1 to 20 slm

Performance time period: 10 minutes to 60 minutes

An example for the number of times Sub-Steps a1 and a2 in Step A1 are repeated may be 2 to 20. An example for the number of times Steps A1 and B1 are repeated may be 2 to 5.

By setting each of the process conditions to a certain value in each of the ranges, the above-described etching process can be properly performed while the temperature of the exhaust pipe 231 is controlled properly.

(Process Conditions in Second and Third Cleaning Steps)

An example of the process conditions in Steps A2 and A3 may be as follows:

Second cleaning temperature: higher than 400 degrees C. and, in some embodiments, 400 to 500 degrees C.

Second cleaning pressure: 1,330 Pa (10 Torr) to 26,600 Pa (200 Torr) and, in some embodiments, 13,300 Pa (100 Torr) to 19,950 Pa (150 Torr)

$F_2$ gas flow rate: 0.2 to 5 slm

HF gas flow rate: 0 slm $N_2$ gas flow rate: 1 to 20 slm

Performance time period: 5 minutes to 10 minutes.

An example of the process conditions in Steps B2 and B3 may be as follows:

Second cleaning temperature: higher than 400 degrees C. and, in some embodiments, 400 to 500 degrees C.

First cleaning pressure: 10 Pa to 50 Pa $F_2$ gas flow rate: 0 slm

HF gas flow rate: 0 slm $N_2$ gas flow rate: 1 to 20 slm

Performance time period: 10 minutes to 60 minutes.

An example for the number of times Steps A2 and B2 are repeated and the number of times Steps A3 and B3 are repeated may be 2 to 5.

By setting each of the process conditions to a certain value in each of the above ranges, the treatment process of surfaces of members in the process chamber 201 and the cleaning process in the nozzles 249a and 249b can be properly performed while the temperature of the exhaust pipe 231 is controlled properly.

Further, in some embodiments, a process time period of the second cleaning step may be longer than a process time period of the third cleaning step. This is because the HCDS gas is a gas containing an element (Si) which can be solidified for itself under the above-described process conditions, i.e., a gas which can deposit a film for itself In addition, the $C_3H_6$ gas, the $O_2$ gas and the $NH_3$ gas are gases containing elements (C, I, N, and H) which cannot be solidified for themselves under the above-described process conditions, i.e., gases which cannot deposit a film for themselves. Therefore, when the above-described film forming process is performed, deposits (mainly composed of Si) adhere more to the nozzle 249a than the nozzle 249b. On the other hand, some deposits mainly composed of Si, SiO, SiN, or the like adhere to the interior of the nozzle 249b due to the HCDS gas which slightly seeps into the nozzle 249b. By setting the process time period of the second and third cleaning steps as described above, etching damage (or over-etching) to the interior (i.e., the inner wall) of the nozzle 249b can be avoided while the deposits deposited within the nozzle 249a are removed reliably. In addition, the same effects can be obtained by setting the flow rate or concentration of the $F_2$ gas supplied in the second cleaning step to be greater than the flow rate or concentration of the $F_2$ gas supplied in the third cleaning step.

(6) Effects of the Embodiment

According to this embodiment, one or more effects are provided as described below.

(a) The first to third cleaning Steps include, respectively, Steps A1 to A3 of cleaning the interior of the process chamber 201 and Steps B1 to B3 of cooling the exhaust pipe 231, while being alternately repeated. Accordingly, it is possible to properly progress the treatment process and the cleaning process with the temperature of the exhaust pipe 231 set to a temperature equal to or lower than the first temperature, i.e., a temperature lower than the critical temperature.

Figure 7:
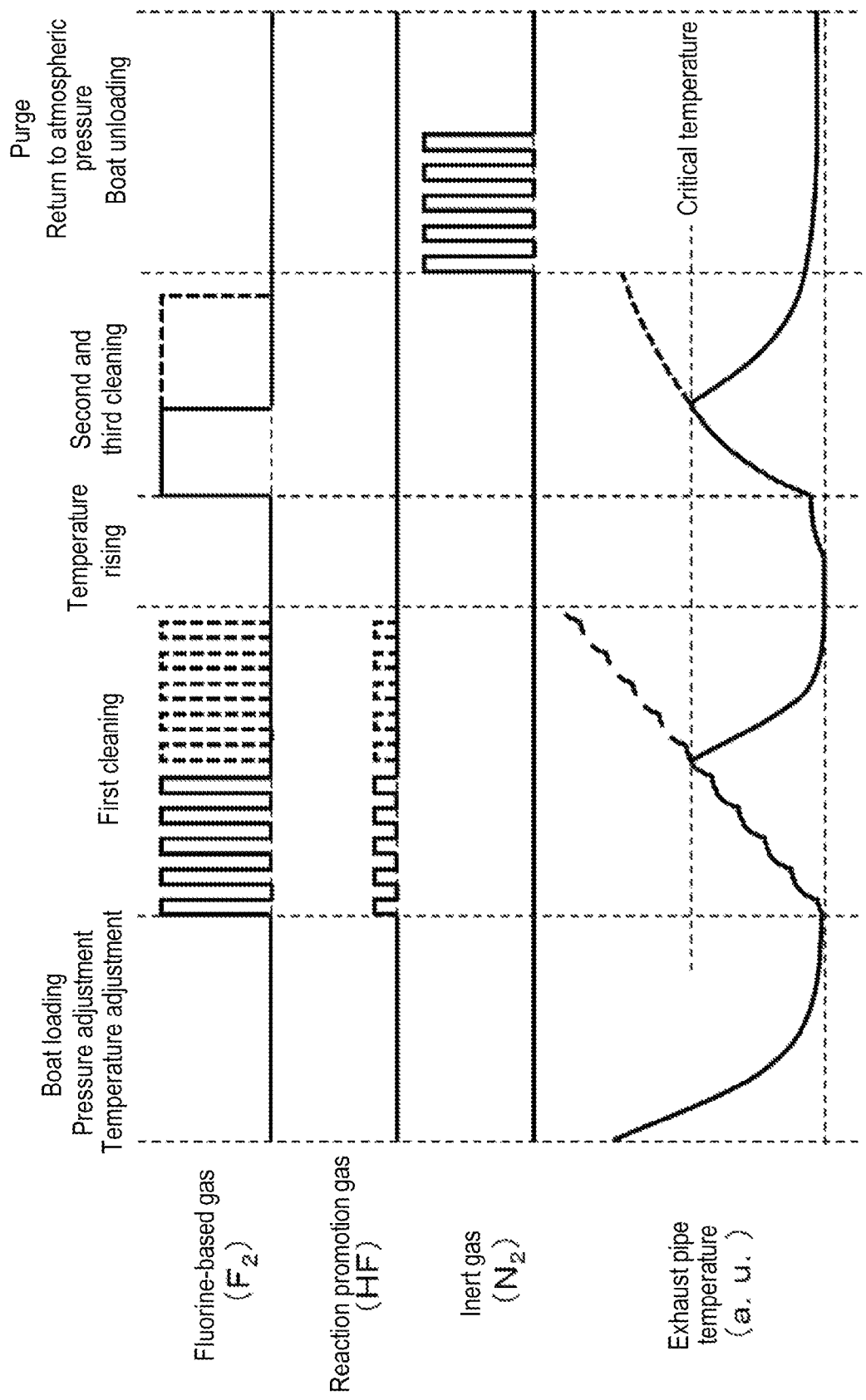
FIG. 7 is a view illustrating gas supply timings and temperature of the exhaust pipe in the cleaning sequence according to a reference example.

For reference, FIG. 7 shows a cleaning sequence of continuously performing Steps A1 to A3 of cleaning the interior of the process chamber 201 without performing Steps B1 to B3 of cooling the exhaust pipe 231 in the first to third cleaning steps. As indicated by broken lines in FIG. 7, if Steps A1 to A3 are continuously performed, the temperature of the exhaust pipe 231 may be increased by the reaction heat of the cleaning gas and the reaction byproducts to exceed the critical temperature. As a result, the exhaust pipe 231 may be corroded.

On the contrary, in this embodiment, since Steps B1 to B3 are performed at the above-described timings, it is possible to prevent the temperature of the exhaust pipe 231 from reaching the critical temperature, i.e., a temperature at which corrosion occurs in the inner wall of the exhaust pipe 231. As a result, the corrosion of the exhaust pipe 231 due to the cleaning process can be prevented, which can result in reduced maintenance costs of the substrate processing apparatus.

(b) As described above, when a gas containing a larger number of Cl atoms included in one molecule, such as HCDS gas, is used as the precursor gas, the reaction byproducts such as $NH_4Cl$ are more likely to be produced and an amount of adhesion of the reaction byproducts is more likely to be increased. In addition, even when the exhaust pipe 231 is configured as a pipe having an uneven structure in its inner wall, such as a bellows pipe, the amount of adhesion of the reaction byproducts to the interior of the exhaust pipe 231 is likely to be increased. Accordingly, in such a case, the temperature of the exhaust pipe 231 is likely to be increased when the cleaning process is performed. This embodiment of performing Steps B1 to B3 at the above-described timings has a great significance in such a case.

(c) As described above, when the degree of opening of the APC valve 244 in Sub-Step a2 is set to be greater than that of the APC valve 244 in Sub-Step a1, a large amount of cleaning gas is introduced at once from the process chamber 201 into the exhaust pipe 231 immediately after Sub-Step a2 starts. This is equally applied to the case of supplying the cleaning gas according to the same procedure as shown in Modification 3. Accordingly, in such a case, the temperature of the exhaust pipe 231 is likely to be increased when the cleaning process is performed. This embodiment of performing Steps B1 to B3 at the above-described timings has a great significance in such a case.

(d) The above-described effects can be obtained only by changing a cleaning recipe so as to perform Steps B1 to B3 at the above-described timings. That is, in this embodiment, since there is no need to complicate the configuration of the exhaust system of the substrate processing apparatus, for example, by installing a separate cooling device such as a chiller unit for cooling the exhaust pipe 231, it is possible to avoid an increase in production costs, remodeling costs and maintenance costs of the substrate processing apparatus. In addition, since no power for actuation of the cooling device is required, it is possible to avoid an increase in power consumption, i.e., operation costs, of the substrate processing apparatus.

(e) In Steps B1 to B3, the exhaust pipe 231 is forced to be cooled by supplying the $N_2$ gas, as a cooling gas, into the exhaust pipe 231. This makes it possible to increase cooling efficiency of the exhaust pipe 231 and shorten the performance time period of Steps B1 to B3. As a result, it is possible to shorten the time period required for the cleaning process, i.e., down time of the substrate processing apparatus, which can result in improved productivity.

(f) In Step A1, by alternately repeating sub Steps a1 and a2 to vary the internal pressure of the process chamber 201 repeatedly, it is possible to increase efficiency of removal of deposits from the process chamber 201. As a result, it is possible to shorten the time required for the cleaning process, i.e., a down time period of the substrate processing apparatus, which can result in improved productivity.

(g) In the first cleaning step, by using the $F_2$ gas and the HF gas, i.e., by using the mixture gas obtained by adding the HF gas to the $F_2$ gas, the etching rate of the deposits can be increased and the cleaning in the process chamber 201 can progress with high efficiency. In addition, in the first cleaning step, by using the $F_2$ gas and the HF gas, the cleaning in the process chamber 201 can progress at a practical speed even if the process conditions such as the internal temperature (e.g., the first cleaning temperature) and so on of the process chamber 201 are set to low temperature conditions. As a result, an etching damage to the quartz members in the process chamber 201 can be alleviated or corrosion of the exhaust pipe 231 can be more reliably avoided.

Other Embodiments of the Present Disclosure

The embodiments of the present disclosure have been described in detail. However, the present disclosure is not limited to the foregoing embodiments and its modifications but may be various modified without departing from the spirit of the present disclosure.

While an example in which the temperature of the exhaust pipe 231 is actually measured using the temperature sensor 231a and the performance of the cleaning process is controlled based on a result of the measurement (e.g., a measurement value) has been illustrated in the above-described embodiment, the present disclosure is not limited thereto. For example, a relationship between (a) a time period for which the cleaning gas is substantially distributed in the exhaust pipe 231, (b) a time period for which the distribution of the cleaning gas in the exhaust pipe 231 is substantially stopped, and (c) increase and decrease of the temperature of the exhaust pipe 231 may be beforehand obtained through experiments or simulations and the performance of the cleaning process may be controlled based on the obtained relationship. That is, the temperature of the exhaust pipe 231 may be estimated based on the time period for which the cleaning gas is substantially distributed in the exhaust pipe 231 and or the time period for which the distribution of the cleaning gas in the exhaust pipe 231 is substantially stopped and the performance of the cleaning process may be controlled based on a result of the estimation. This eliminates a need to install the temperature sensor 231a in the exhaust pipe 231, which can result in a simplified configuration of the substrate processing apparatus and reduced production costs thereof In addition, for example, a sub-heater (e.g., jacket heater), which is a heating instrument, may be installed in the exhaust pipe 231. When the above-described film forming process is performed, by heating the exhaust pipe 231 using the sub-heater, it is possible to prevent reaction byproducts from adhering to the interior of the exhaust pipe 231. However, even when the exhaust pipe 231 is heated by the sub-heater in performing the film forming process, since it is difficult to completely prevent reaction byproducts from adhering to the interior of the exhaust pipe 231, the above-mentioned problems occur when the cleaning process is performed. In addition, when the above-described cleaning process is performed, it is necessary to turn off the sub-heater to stop the heating of the exhaust pipe 231 by the sub-heater so that the exhaust pipe 231 cannot be heated.

In addition, while an example in which a mixture of the $F_2$ gas, which is a fluorine-based gas, and the HF gas, which is a reaction promoting gas, is used as a cleaning gas and an example in which only the F2 gas is used as the cleaning gas have been illustrated in the above-described embodiment, the present disclosure is not limited thereto. Specifically, as the cleaning gas, fluorine-based gases such as $F_2$ gas, chlorine trifluoride ($ClF_3$) gas, nitrogen trifluoride ($NF_3$) gas, hydrogen fluoride (HF) gas, and the like may be used alone or in any combination. In addition, as the reaction promotion gas, an $H_2$ gas, an $O_2$ gas, an $HN_3$ gas, or further a nitrogen oxide-based gas such as NO gas, $N_2O$ gas, $NO_2$ gas or the like may be used.

In addition, for example, an example in which the interior of the process chamber 201 and the interiors of the nozzles 249a and 249b are cleaned after the SiOCN film is formed on the wafer 200 according to the film forming sequence shown in FIG. 4, i.e., the following film forming sequence, has been illustrated in the above-described embodiment.

$NH_3 \rightarrow (HCDS \rightarrow C_3H_6 \rightarrow O_2 \rightarrow NH_3) \times n \Rightarrow$ SiOCN film However, the present disclosure is not limited thereto. Specifically, the above-described cleaning process may be appropriately performed even after a silicon-based insulating film such as a SiOCN film, a silicon carbonitride film (SiCN film), a silicon oxynitride film (SiON film), a silicon nitride film (SiN film), a silicon borocarbonitride film (SiBCN film), a silicon boronitride film (SiBN film), or the like is formed on the wafer according to the following film forming sequences.

$NH_3 \rightarrow (C_3H_6 \rightarrow HCDS \rightarrow C_3H_6 \rightarrow O_2 \rightarrow NH_3) \times n \Rightarrow$ SiOCN film $NH_3 \rightarrow (HCDS \rightarrow C_3H_6 \rightarrow NH_3 \rightarrow O_2) \times n \Rightarrow$ SiOCN film
$NH_3 \rightarrow (HCDS \rightarrow C_3H_6 \rightarrow NH_3) \times n \Rightarrow$ SiCN film
$NH_3 \rightarrow (HCDS \rightarrow NH_3 \rightarrow O_2) \times n \Rightarrow$ SiON film
$NH_3 \rightarrow (HCDS \rightarrow NH_3) \times n \Rightarrow$ SiN film
$NH_3 \rightarrow (HCDS \rightarrow C_3H_6 \rightarrow BCl_3 \rightarrow NH_3) \times n \Rightarrow$ SiBCN film
$NH_3 \rightarrow (HCDS \rightarrow BCl_3 \rightarrow NH_3) \times n \Rightarrow$ SiBN film Each step in these film forming sequences may have the same procedure and process conditions as the above-described embodiment. In addition, in a step of supplying $BCl_3$ gas into the wafer 200, the $BCl_3$ gas flows from the gas supply pipe 232b. In addition, a supply flow rate of the $BCl_3$ gas controlled by the MFC 241b is set to fall within a range of, for example, 100 to 10,000 sccm. Other process conditions are the same as those in Step 2 of the film forming sequence shown in FIG. 4.

In addition, for example, the above-described cleaning process may be properly performed even after forming a metal-based film containing titanium (Ti), zirconium (Zr), hafnium (Hf), tantalum (Ta), niobium (Nb), aluminum (Al), molybdenum (Mo), tungsten (W), or the like on the wafer 200.

When the metal-based film is formed, as a precursor gas, an inorganic metal gas containing a metal element and a halogen element, such as titanium tetrachloride ($TiCl_4$) gas, titanium tetrafluoride ($TiF_4$) gas, zirconium tetrachloride ($ZrCl_4$) gas, zirconium tetrafluoride ($ZrF_4$) gas, hafnium tetrachloride ($HfCl_4$) gas, hafnium tetrafluoride ($HfF_4$) gas, tantalum pentachloride ($TaCl_5$) gas, tantalum pentafluoride ($TaF_5$) gas, niobium pentachloride ($NbCl_5$) gas, niobium pentafluoride ($NbF_5$) gas, aluminum trichloride. ($AlCl_3$) gas, aluminum trifluoride ($AlF_3$) gas, molybdenum pentachloride ($MoCl_5$) gas, molybdenum pentafluoride ($MoF_5$) gas, tungsten hexachloride ($WCl_6$) gas, tungsten hexafluoride ($WF_6$) gas, or the like, may be used. In addition, as the precursor gas, an organic metal gas containing a metal element and a halogen element, such as trimethylaluminum ($Al(CH_3)_3$, abbreviation: TMA) gas may be used. As a reaction gas, the same gas as the above-described embodiment may be used.

For example, according to the following film forming sequences, a titanium nitride film (TiN film), a tantalum nitride film (TaN film), a titanium aluminum nitride film (TiAlN film) or a tantalum aluminum nitride film (TaAlN film) may be formed on the wafer 200. Each step in these film forming sequences may have the same procedure and process conditions as the above-described embodiment.

$NH_3 \rightarrow (TiCl_4 \rightarrow NH_3) \times n \Rightarrow$ TiN film
$NH_3 \rightarrow (TaCl_5 \rightarrow NH_3) \times n \Rightarrow$ TaN film
$NH_3 \rightarrow (TiCl_4 \rightarrow TMA \rightarrow NH_3) \times n \Rightarrow$ TiAlN film
$NH_3 \rightarrow (TaCl_5 \rightarrow TMA \rightarrow NH_3) \times n \Rightarrow$ TaAlN film As described above, the present disclosure can be suitably applied to clean the interior of the process chamber by removing deposits including a semiconductor-based thin film such as a silicon-based insulating film or the like and a metal-based thin film such as a conductive metal film or the like. In those cases, the interior of the process chamber can be cleaned with the same procedures and process conditions as the above-described embodiment. In those cases, the same effects as the above-described embodiment and its modifications are obtained. In addition, in the above-described film forming sequences, the surface modifying step of supplying the $NH_3$ gas may not be performed. However, in some embodiments, the surface modifying step is performed so that adsorption of precursor gas, carbon-containing gas, and the like onto the wafer can be promoted. The processing recipe for use in forming those various kinds of thin films (program in which procedures or process conditions of the film forming process are described) or the cleaning recipe for use in removing deposits including these various kinds of thin films (program in which procedures or process conditions of the cleaning process are described) may be individually prepared (a plurality of things is prepared) based on contents of the film forming process or the cleaning process (a kind of film to be formed or removed, a composition ratio, a film quality, a film thickness, and the like). In addition, when a substrate processing is initiated, a suitable processing recipe or cleaning recipe may be selected among a plurality of processing recipes or cleaning recipes based on contents of the substrate processing. Specifically, the plurality of recipes individually prepared depending on contents of the substrate processing may be previously stored (or installed) in the memory device 121c provided in the substrate processing apparatus via an electrical communication line or a recording medium (e.g., the external memory device 123) in which the recipes are recorded. In addition, when the film forming process or the cleaning process is initiated, the CPU 121a provided in the substrate processing apparatus may appropriately select a suitable recipe among the plurality of recipes stored in the memory device 121c based on contents of the substrate processing. With this configuration, thin films having a variety of film types, composition ratios, film qualities and film thicknesses can be formed or removed with high versatility and high reproducibility in one substrate processing apparatus. In addition, since an operator's work load (e., a load of inputting procedures or process conditions, or the like) can be lessened, it is possible to rapidly initiate the substrate processing while avoiding an operational error.

The above-described processing recipe or cleaning recipe is not limited to a newly prepared recipe and may be prepared, for example, by modifying an existing recipe that is already installed in the substrate processing apparatus. When the recipe is modified, the modified recipe may be installed on the substrate processing apparatus via an electrical communication line or a recording medium in which the recipe is recorded. In addition, the recipe previously installed in the substrate processing apparatus may be directly changed by manipulating the input/output device 122 of the substrate processing apparatus.

In the above-described embodiment, an example of using a batch type substrate processing apparatus in which a plurality of substrates is processed at once for forming a thin film has been illustrated. The present disclosure is not limited thereto but may be appropriately applied to a case in which a single-wafer type substrate processing apparatus which processes one or several substrates at once is used to form a thin film. In addition, in the above-described embodiment, an example of using a substrate processing apparatus having a hot wall type processing furnace in forming a thin film is disclosed. The present disclosure is not limited thereto but may be appropriately applied to a case in which a substrate processing apparatus having a cold wall type processing furnace is used to form a thin film. In those cases, process conditions may be the same as those in the above-described embodiment.

Figure 8A:
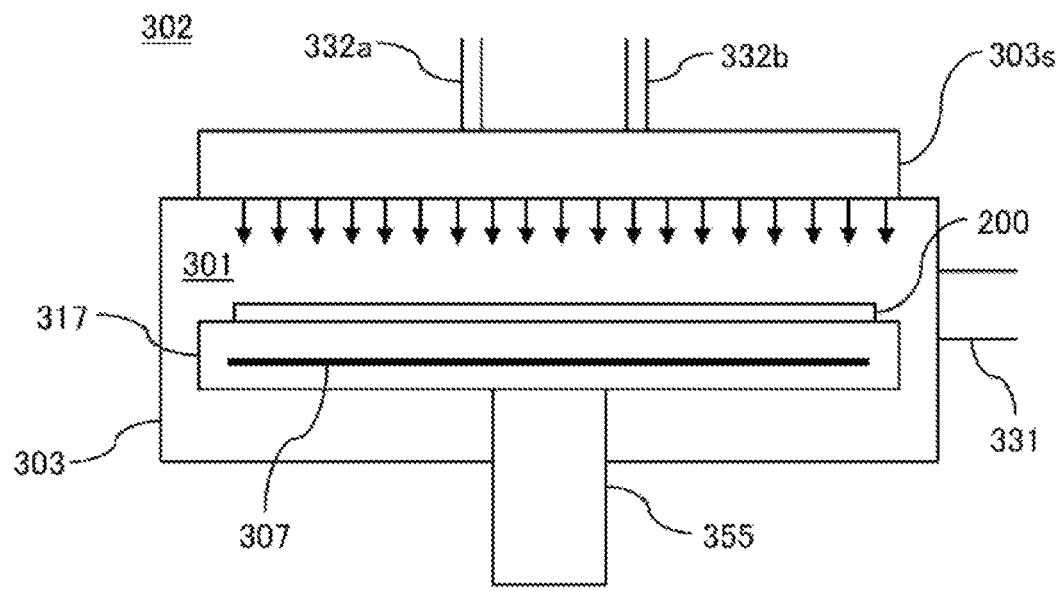
FIGS. 8A and 8B are schematic views illustrating a configuration of a vertical processing furnace of a substrate processing apparatus suitably used in another embodiment of the present disclosure, in which a portion of the processing furnace is shown in a longitudinal sectional view.

For example, the present disclosure may be appropriately applied to the case in which a substrate processing apparatus having a processing furnace 302 shown in FIG. 8A is used to form a film. The processing furnace 302 includes a process vessel 303 forming a process chamber 301, a shower head 303s which supplies a gas in the form of a shower into the process chamber 301, a support base 317 which supports one or several wafers 200 in a horizontal position, a rotary shaft 355 which supports the support base 317 from a bottom end of the support base 317, and a heater 307 installed in the support base 317. An inlet (i.e., gas introduction port) of the shower head 303s is connected with a gas supply port 332a for supplying the above-described precursor gas and a gas supply port 332b for supplying the above-described reaction gas. The gas supply port 332a is connected with a precursor gas supply system which is similar to the precursor gas supply system in the above-described embodiment. The gas supply port 332b is connected with a reaction gas supply system which is similar to the reaction gas supply system in the above-described embodiment. The gas supply ports 332a and 332b are connected with a cleaning gas supply system which is similar to the cleaning gas supply system in the above-described embodiment. A gas distribution plate for supplying a gas in the form of a shower into the process chamber 301 is installed in an outlet (i.e., gas discharging port) of the shower head 303s. An exhaust port 331 for exhausting the interior of the process chamber 301 is installed in the process vessel 303. The exhaust port 331 is connected with an exhaust system which is similar to the exhaust system in the above-described embodiment.

Figure 8B:
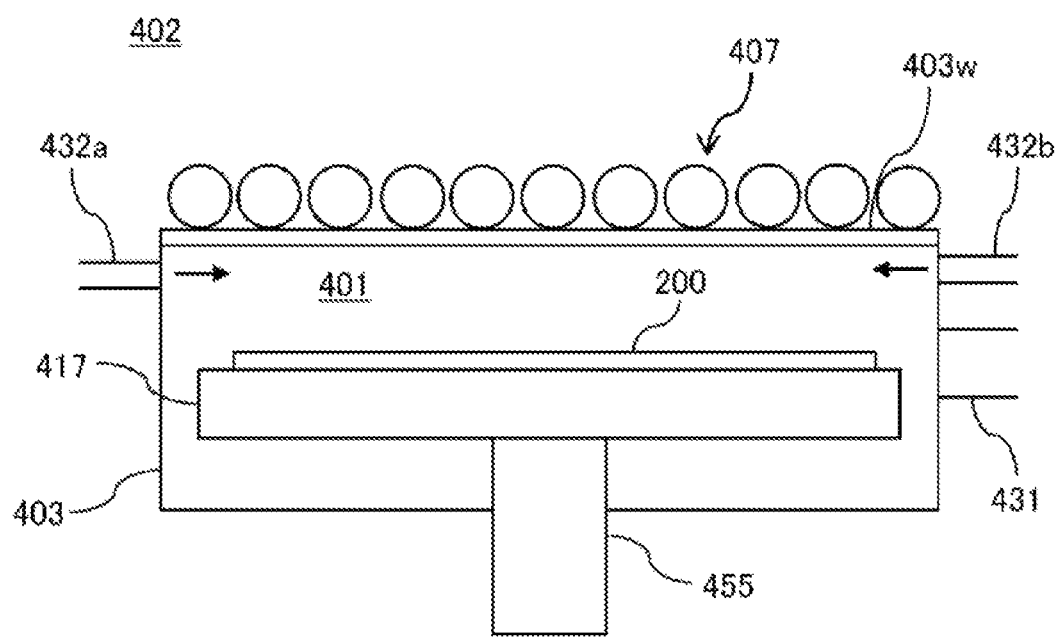

In addition, for example, the present disclosure may be appropriately applied to the case in which a substrate processing apparatus having a processing furnace 402 shown in FIG. 8B is used to form a film. The processing furnace 402 includes a process vessel 403 forming a process chamber 401, a support base 417 which supports one or several wafers 200 in a horizontal position, a rotary shaft 455 which supports the support base 417 from a bottom end of the support base 417, a lamp heater 407 which performs light irradiation on the wafers 200 in the process vessel 403, and a quartz window 403w which transmits the light from the lamp heater 407. The process vessel 403 is connected with a gas supply port 432a for supplying the above-described precursor gas and a gas supply port 432b for supplying the above-described reaction gas. The gas supply port 432a is connected with a precursor gas supply system which is similar to the precursor gas supply system in the above-described embodiment. The gas supply port 432b is connected with a reaction gas supply system which is similar to the reaction gas supply system in the above-described embodiment. The gas supply ports 432a and 432b are connected with a cleaning gas supply system which is similar to the cleaning gas supply system in the above-described embodiment. An exhaust port 431 for exhausting the interior of the process chamber 401 is installed in the process vessel 403. The exhaust port 431 is connected with an exhaust system which is similar to the exhaust system in the above-described embodiment.

When those substrate processing apparatuses are used, a film forming process and a cleaning process can be performed with the same sequence and process conditions as the above-described embodiment and modifications.

In addition, the above-described embodiments and modifications may be used in proper combination. Process conditions at that time may be the same as those in the above-described embodiment.

Aspects of the Present Disclosure

Hereinafter, some aspects of the present disclosure will be supplemented.
(Supplementary Note 1)
According to an aspect of the present disclosure, there is provided a cleaning method including cleaning an interior of a process chamber in which a substrate is processed, by supplying a cleaning gas into the process chamber and exhausting the cleaning gas from the process chamber via an exhaust pipe; and cooling the exhaust pipe by maintaining a state where distribution of the cleaning gas into the exhaust pipe is substantially stopped, wherein the act of cleaning the interior of the process chamber and the act of cooling the exhaust pipe are repeated alternately.
(Supplementary Note 2)
In the cleaning method according to Supplementary Note 1, the act of cleaning the interior of the process chamber is performed until a temperature of the exhaust pipe reaches a first temperature and the act of cooling the exhaust pipe is performed until the temperature of the exhaust pipe reaches a second temperature lower than the first temperature.

(Supplementary Note 3)

In the cleaning method according to Supplementary Note 2, the first temperature is lower than a temperature at which corrosion occurs in the exhaust pipe.

(Supplementary Note 4)

In the cleaning method according to Supplementary Note 2 or 3, the second temperature is equal to or lower than ½ of the first temperature.

(Supplementary Note 5)

In the cleaning method according to any one of Supplementary Notes 1 to 4, the act of cooling the exhaust pipe includes distributing an inert gas in the exhaust pipe.

(Supplementary Note 6)

In the cleaning method according to any one of Supplementary Notes 1 to 5, a time period for performing the act of cooling the exhaust pipe is longer than a time period for performing the act of cleaning the interior of the process chamber.

(Supplementary Note 7)

In the cleaning method according to any one of Supplementary Notes 1 to 6, the act of cleaning the interior of the process chamber includes repeating a cycle including supplying the cleaning gas into the process chamber; and exhausting the cleaning gas from the process chamber via the exhaust pipe under a state where supply of the cleaning gas into the process chamber is stopped.

(Supplementary Note 8)

In the cleaning method according to Supplementary Note 7, a time period for performing the act of cooling the exhaust pipe is longer than a time period for performing the cycle once.

(Supplementary Note 9)

In the cleaning method according to any one of Supplementary Notes 1 to 8, the act of cleaning the interior of the process chamber comprises supplying the cleaning gas via a nozzle installed in the process chamber.

(Supplementary Note 10)

In the cleaning method according to any one of Supplementary Notes 1 to 9, the act of cooling the exhaust pipe includes cooling the exhaust pipe by nature or cooling the exhaust pipe forcibly by supplying an inert gas into the exhaust pipe.

(Supplementary Note 11)

The cleaning method according to any one of Supplementary Notes 1 to 10 further includes providing the process chamber, after the substrate is processed, by supplying a process gas to the substrate in the process chamber and exhausting the process gas from the process chamber via the exhaust pipe.

(Supplementary Note 12)

In the cleaning method according to Supplementary Note 11, the process gas includes a gas containing a halogen element (e.g., a halogen-based gas) and a gas containing nitrogen and hydrogen (e.g., a hydrogen nitride-based gas). The gas containing the halogen element contains three or more halogen elements in one molecule.

(Supplementary Note 13)

In the cleaning method according to any one of Supplementary Notes 1 to 12, the cleaning gas includes a fluorine-based gas.

(Supplementary Note 14)

According to another aspect of the present disclosure, there is provided a method of manufacturing a semiconductor device, including processing a substrate in a process chamber by supplying a process gas to the substrate and exhausting the process gas from the process chamber via an exhaust pipe; and cleaning an interior of the process chamber, wherein the act of cleaning the interior of the process chamber includes cleaning the interior of the process chamber by supplying a cleaning gas into the process chamber and exhausting the cleaning gas from the process chamber via the exhaust pipe; and cooling the exhaust pipe by maintaining a state where distribution of the cleaning gas into the exhaust pipe is substantially stopped, wherein the act of cleaning the interior of the process chamber and the act of cooling the exhaust pipe are repeated alternately.

(Supplementary Note 15)

According to still another aspect of the present disclosure, there is provided a substrate processing apparatus including a process chamber in which a substrate is processed; a supply system configured to supply a gas into the process chamber; an exhaust system configured to exhaust an interior of the process chamber via an exhaust pipe; and a control unit configured to control the supply system and the exhaust system to perform cleaning the interior of the process chamber by supplying a cleaning gas into the process chamber and exhausting the cleaning gas from the process chamber via the exhaust pipe; and cooling the exhaust pipe by maintaining a state where distribution of the cleaning gas into the exhaust pipe is substantially stopped, wherein the act of cleaning the interior of the process chamber and the act of cooling the exhaust pipe are alternately repeated.

(Supplementary Note 16)

According to still another aspect of the present disclosure, there is provided a non-transitory computer-readable recording medium storing a program that causes a computer to perform processes of cleaning an interior of a process chamber in which a substrate is processed, by supplying a cleaning gas into the process chamber and exhausting the cleaning gas from the process chamber via an exhaust pipe; and cooling the exhaust pipe by maintaining a state where distribution of the cleaning gas into the exhaust pipe is substantially stopped, wherein the act of cleaning the interior of the process chamber and the act of cooling the exhaust pipe are repeated alternately.

According to the present disclosure in some embodiments, it is possible to prevent an exhaust pipe from being corroded during a cleaning process.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A cleaning method comprising:
cleaning an interior of a process chamber in which a substrate is processed, by supplying a cleaning gas into the process chamber and exhausting the cleaning gas from the process chamber via an exhaust pipe; and
cooling the exhaust pipe by maintaining a state where distribution of the cleaning gas into the exhaust pipe is substantially stopped,
wherein the act of cleaning the interior of the process chamber and the act of cooling the exhaust pipe are repeated alternately.

2. The cleaning method of claim 1, wherein the act of cleaning the interior of the process chamber is performed until a temperature of the exhaust pipe reaches a first temperature and the act of cooling the exhaust pipe is performed until the temperature of the exhaust pipe reaches a second temperature lower than the first temperature.

3. The cleaning method of claim 2, wherein the first temperature is lower than a temperature at which corrosion occurs in the exhaust pipe.

4. The cleaning method of claim 2, wherein the second temperature is equal to or lower than ½ of the first temperature.

5. The cleaning method of claim 1, wherein the act of cooling the exhaust pipe includes distributing an inert gas in the exhaust pipe.

6. The cleaning method of claim 1, wherein a time period for performing the act of cooling the exhaust pipe is longer than a time period for performing the act of cleaning the interior of the process chamber.

7. The cleaning method of claim 1, wherein the act of cleaning the interior of the process chamber comprises repeating a cycle comprising:
supplying the cleaning gas into the process chamber; and
exhausting the cleaning gas from the process chamber via the exhaust pipe under a state where supply of the cleaning gas into the process chamber is stopped.

8. The cleaning method of claim 7, wherein a time period for performing the act of cooling the exhaust pipe is longer than a time period for performing the cycle once.

9. The cleaning method of claim 1, wherein the act of cleaning the interior of the process chamber comprises supplying the cleaning gas via a nozzle installed in the process chamber.

10. The cleaning method of claim 1, wherein the act of cooling the exhaust pipe includes cooling the exhaust pipe by nature or cooling the exhaust pipe forcibly by supplying an inert gas into the exhaust pipe.

11. The cleaning method of claim 1, further comprising providing the process chamber, after the substrate is processed, by supplying a process gas to the substrate in the process chamber and exhausting the process gas from the process chamber via the exhaust pipe.

12. The cleaning method of claim 11, wherein the process gas includes a gas containing a halogen element and a gas containing nitrogen and hydrogen.

13. The cleaning method of claim 1, wherein the cleaning gas includes a fluorine-based gas.

14. A method of manufacturing a semiconductor device, comprising:
processing a substrate in a process chamber by supplying a process gas to the substrate and exhausting the process gas from the process chamber via an exhaust pipe; and
cleaning an interior of the process chamber,
wherein the act of cleaning the interior of the process chamber comprises:
cleaning the interior of the process chamber by supplying a cleaning gas into the process chamber and exhausting the cleaning gas from the process chamber via the exhaust pipe; and
cooling the exhaust pipe by maintaining a state where distribution of the cleaning gas into the exhaust pipe is substantially stopped,
wherein the act of cleaning the interior of the process chamber and the act of cooling the exhaust pipe are repeated alternately.

15. A substrate processing apparatus comprising:
a process chamber in which a substrate is processed;
a supply system configured to supply a gas into the process chamber;
an exhaust system configured to exhaust an interior of the process chamber via an exhaust pipe; and
a control unit configured to control the supply system and the exhaust system to perform cleaning the interior of the process chamber by supplying a cleaning gas into the process chamber and exhausting the cleaning gas from the process chamber via the exhaust pipe; and
cooling the exhaust pipe by maintaining a state where distribution of the cleaning gas into the exhaust pipe is substantially stopped, wherein the act of cleaning the interior of the process chamber and the act of cooling the exhaust pipe are repeated alternately.

16. A non-transitory computer-readable recording medium storing a program that causes a computer to perform a process of:
cleaning an interior of a process chamber in which a substrate is processed, by supplying a cleaning gas into the process chamber and exhausting the cleaning gas from the process chamber via an exhaust pipe; and
cooling the exhaust pipe by maintaining a state where distribution of the cleaning gas into the exhaust pipe is substantially stopped,
wherein the act of cleaning the interior of the process chamber and the act of cooling the exhaust pipe are repeated alternately.

\* \* \* \* \*